(12) United States Patent
Tsai

(10) Patent No.: US 10,116,323 B2
(45) Date of Patent: Oct. 30, 2018

(54) ANALOG-TO-DIGITAL CONVERTER

(71) Applicant: MEDIATEK Inc., Hsin-Chu (TW)

(72) Inventor: Jen-Huan Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/603,546

(22) Filed: May 24, 2017

(65) Prior Publication Data

US 2018/0175875 A1    Jun. 21, 2018

Related U.S. Application Data

(60) Provisional application No. 62/435,094, filed on Dec. 16, 2016.

(51) Int. Cl.
   *H03M 3/00* (2006.01)
   *H03M 1/12* (2006.01)
   *H03M 1/06* (2006.01)
   *H03M 1/46* (2006.01)

(52) U.S. Cl.
   CPC ......... *H03M 3/426* (2013.01); *H03M 1/0626* (2013.01); *H03M 1/1245* (2013.01); *H03M 1/468* (2013.01); *H03M 3/458* (2013.01); *H03M 3/47* (2013.01)

(58) Field of Classification Search
   None
   See application file for complete search history.

(56) References Cited

U.S. PATENT DOCUMENTS

| | | | | |
|---|---|---|---|---|
| 3,843,940 A * | 10/1974 | Ishiguro | ............. | H03M 7/3044 348/472 |
| 4,017,849 A * | 4/1977 | Tewksbury | ............. | H03M 3/04 341/143 |
| 4,692,737 A * | 9/1987 | Stikvoort | ............. | H03M 3/444 341/144 |
| 6,940,436 B2 * | 9/2005 | Hezar | ................... | H03M 3/412 341/143 |
| 6,956,513 B1 * | 10/2005 | Wang | .................... | H03M 3/358 341/143 |
| 9,197,240 B1 | 11/2015 | Kinyua | | |
| 2016/0182072 A1 | 6/2016 | Preyler et al. | | |
| 2016/0373125 A1 * | 12/2016 | Pagnanelli | ............ | H03M 3/404 |

OTHER PUBLICATIONS

Fredenburg, et al.: "A 90-MS/s 11-MHz-Bandwidth 62-dB SNDR Noise-Shaping SAR ADC"; IEEE Journal of Solid-State Circuits, vol. 47, No. 12, Dec. 2012; pp. 2898-2904.

(Continued)

*Primary Examiner* — Howard Williams
(74) *Attorney, Agent, or Firm* — McClure, Qualey & Rodack, LLP

(57) ABSTRACT

The invention provides an analog-to-digital converter (ADC) converting an input signal to an output signal. The ADC may comprise a main circuit and a comparator coupled to the main circuit. The main circuit may: transfer the input signal by an input transfer block, filter an error signal by a loop filter, and combine the transferred input signal and the filtered error signal to form a combined signal. The comparator may quantize the combined signal to provide the output signal, wherein the error signal may reflect a difference between the combined signal and the output signal.

22 Claims, 20 Drawing Sheets

(56) References Cited

OTHER PUBLICATIONS

Chen, et al.: "Noise-shaping SAR ADC using three capacitors"; Electronics Letters Jan. 31, 2013 vol. 49 No. 3; pp. 1-2.
Chen, et al.: "A 9.35-ENOB, 14.8 fJ/conv.-step Fully-Passive Noise-Shaping SAR ADC"; 2015 Symposium on VLSI Circuits Digest of Technical Papers; pp. C64-C65.
Shu, et al.: "An Oversampling SAR ADC with DAC Mismatch Error Shaping Achieving 105dB SFDR and 101dB SNDR over 1kHz BW in 55nm CMOS"; ISSCC 2016 / Session 27 / Hybrid and Nyquist Data Converters / 27.2; pp. 458-460.
Kim, et al.: "nth-order multi-bit $\Sigma\Delta$ ADC using SAR quantiser"; Electronics Leiters Sep. 16, 2010 vol. 46 No. 19; pp. 1-2.
Chen, et al.: "A 2nd Order Fully-Passive Noise-Shaping with Embedded Passive Gain"; IEEE Asian Solid-State Circuits Conference Nov. 7-9, 20 16/Toyama. Japan; pp. 1-4.
EPO Search Report dated Dec. 12, 2017 in European application (No. 1717693931-1805).

* cited by examiner

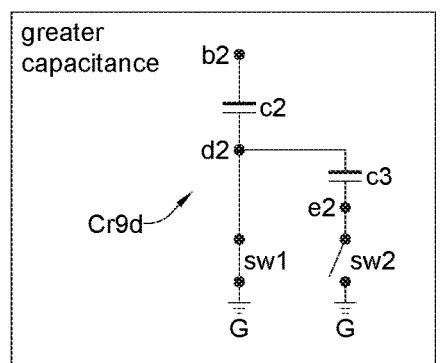
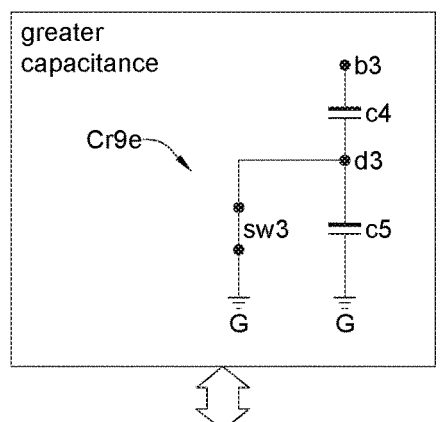
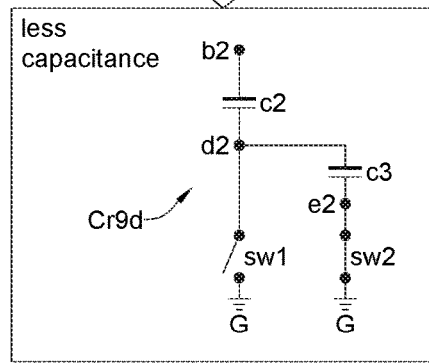
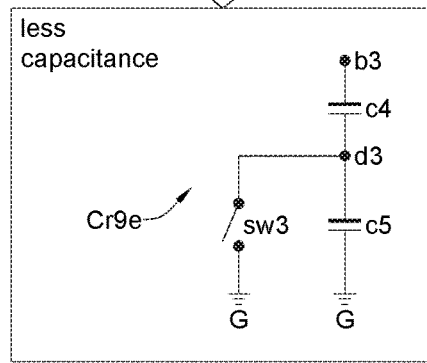
FIG. 9d  FIG. 9e

US 10,116,323 B2

ANALOG-TO-DIGITAL CONVERTER

This application claims the benefit of U.S. provisional application Ser. No. 62/435,094, filed Dec. 16, 2016, the disclosure of which is incorporated by reference herein in its entirety.

FIELD OF THE INVENTION

The present invention relates to analog-to-digital converter (ADC), and more particularly, to improved ADC with enhanced noise shaping.

BACKGROUND OF THE INVENTION

ADC is essential for modern electronic devices; for example, ADC is broadly utilized in communication circuitry (e.g., wireless transceiver) of mobile phones and smart phones.

SUMMARY OF THE INVENTION

An objective of the invention is providing an ADC (e.g., 100, 200, 300, 400, 500, 600, 700 or 800 shown in FIG. 1, 2, 3a, 4a, 5a, 6a, 7a or 8a) converting an input signal (e.g., V) to an output signal (e.g., D). The ADC may comprise a main circuit (e.g., 110, 210, 310, 410, 510, 610, 710 or 810 in FIG. 1, 2, 3a, 4a, 5a, 6a, 7a or 8a) and a comparator (e.g., 120, 220, 320, 420, 520, 620e, 720 or 820 FIG. 1, 2, 3a, 4a, 5a, 6a, 7a or 8a) coupled to the main circuit. The main circuit may be for: transferring the input signal by an input transfer block (e.g., 112, 212, 512 or 812 in FIG. 1, 2, 5a or 8a) to form a transferred input signal (e.g., Vf1 in FIG. 1, 2, 5a or 8a), filtering an error signal (e.g., Ve in FIG. 1, 2, 5a or 8a) by a loop filter (e.g., 118, 218, 518 or 818 in FIG. 1, 2, 5a or 8a) to form a filtered error signal (e.g., Vf2 in FIG. 1, 2, 5a or 8a), and forming a combined signal (e.g., Vx in FIG. 1, 2, 5a or 8a) combining the transferred input signal and the filtered error signal. The comparator may be for: quantizing the combined signal to provide the output signal. Wherein the error signal may reflect a difference between the combined signal and the output signal.

In an embodiment (e.g., FIG. 2, 5a or 8a), the input transfer block may comprise an input scaling unit (e.g., 213, 513 or 813 in FIG. 2, 5a or 8a) for scaling the input signal, and the loop filter may comprise a first delay unit (e.g., 226, 526 or 826 in FIG. 2, 5a or 8a) and at least a loop scaling unit (e.g., 222/224/228, 522/528 or 822/824/828 in FIG. 2, 5a or 8a) for delaying and scaling the error signal. In an embodiment (e.g., FIG. 8a), the loop filter may further comprise a second delay unit (e.g., 834) for delaying an internal signal (e.g., Vy) to form a second delayed signal (e.g., Vy2); wherein the internal signal is a combination of the error signal and the second delayed signal; and the first delay unit (e.g., 826) may be arranged to delay the internal signal to form a first delayed signal (e.g., Vy1), wherein the filtered error signal (e.g., Vf2) is formed by scaling the first delayed signal.

In an embodiment (e.g., FIG. 3a/3b/3c, 4a/4b, 5b/5c, 6a/6b or 7a/7b/7c), the ADC (e.g., 300, 400, 600 or 700 in FIG. 3a, 4a, 6a or 7a) may be coupled to the input signal at a first node (e.g., n3a, n4a, n6a or n7a in FIG. 3a, 4a, 6a or 7a), and may convert a sample (e.g., V[i] in FIG. 3b, 5b or 7b, or V[2*i] in FIG. 6b) of the input signal to a sample (e.g., D[i] in FIG. 3b, 5b or 7b, or D[2*i] in FIG. 6b) of the output signal during a cycle (e.g., T[i] in FIG. 3b/3c, 4b, 5b/5c, 6b or 7b/7c). The main circuit (e.g., 310, 410, 610 or 710 in FIG. 3a, 4a, 6a or 7a) may comprise: a capacitor array (e.g., Cs in FIG. 3a, 4a, 6a or 7a) coupled to a second node (e.g., n3b, n4b, n6b or n7b in FIG. 3a, 4a, 6a or 7a), an auxiliary capacitor (e.g., Cr in FIG. 3a, 4a, 6a or 7a) coupled to a third node (e.g., n3c, n4c, n6c or n7c in FIG. 3a, 4a, 6a or 7a), a first switch (e.g., ss3, ss4, ss6e or ss7 in FIG. 3a, 4a, 6a or 7a) coupled between the first node and the second node, and a second switch (e.g., sr3, sr4, sr6e or sr7 in FIG. 3a, 4a, 6a or 7a) coupled between the second node and the third node. The cycle may comprise a sampling phase (e.g., Ta[i] in FIG. 3b/3c, 4b, 5b/5c, 6b or 7b/7c), a combining phase (e.g., Tb[i] in FIG. 3b/3c, 4b or 7b/7c, or Tf[i] in FIG. 5b/5c or 6b), and a comparison phase (e.g., Tc[i] in FIG. 3b/3c, 4b, 5b/5c, 6b or 7b/7c). During the sampling phase, the first switch may be on (closed) to conduct the first node to the second node, and the second switch may be off (open) to stop conduction between the second node and the third node. During the combining phase, the first switch may be off (open) to stop conduction between the first node and the second node, and the second switch may be on (closed) to conduct the third node to the second node, so the combined signal may be formed at the second node. During the comparison phase, the first switch may be off, the second switch may be on, the comparator may be enabled to quantize the combined signal and provide the sample of the output signal, and the capacitor array may receive a feedback of the output signal to form the error signal at the second node.

In an embodiment (e.g., FIG. 3a/3b/3c, 4a/4b, 5b/5c, 6a/6b or 7a/7b/7c), the auxiliary capacitor (e.g., Cs) may be variable to selectively provide a first capacitance (e.g., 1'C in FIG. 3c, 4b, 5c, or 7c) and a different second capacitance (e.g., n*C in FIG. 3c, 4b, 5c or 7c). The cycle (e.g., T[i] in FIG. 3b/3c, 4b, 5b/5c, 6b or 7b/7c) may further comprise a first scaling phase (e.g., Td[i] in FIG. 3b/3c, 4b, 5b/5c, 6b or 7b/7c) after the comparison phase. During the comparison phase, the auxiliary capacitor may provide the first capacitance. During the first scaling phase, the first switch may be off, the second switch may be on, and the auxiliary capacitor may provide the second capacitance.

In an embodiment (e.g., FIG. 3b/3c, 4b or 7b/7c), the cycle (e.g., T[i] in FIG. 3b/3c, 4b or 7b/7c) may further comprise a second scaling phase (e.g., Te[i] in FIG. 3b/3c, 4b, or 7b/7c) after the first scaling phase (e.g., Td[i] in FIG. 3b/3c, 4b, or 7b/7c). During the second scaling phase, the first switch and the second switch may be off, and the auxiliary capacitor may provide the first capacitance.

In an embodiment (e.g., FIG. 5b/5c or 6b), the cycle (e.g., T[i] in FIG. 5b/5c or 6b) may further comprise a second scaling phase (e.g., Tg[i] in FIG. 5b/5c or 6b) between the combining phase (e.g., Tf[i] in FIG. 5b/5c or 6b) and the comparison phase (e.g., Tc[i] in FIG. 5b/5c or 6b). During the second scaling phase, the first switch may be off, the second switch may be on, and the auxiliary capacitor may provide the first capacitance.

In an embodiment (e.g., FIG. 4a), the comparator (e.g., 420 in FIG. 4a) may comprise a positive terminal (e.g., 422) and a negative terminal (e.g., 424), and may quantize the combined signal by comparing signals at the positive terminal and the negative terminal, wherein the positive terminal (e.g., 422) may be coupled to the third node (e.g., n4c).

In an embodiment (e.g., FIG. 3a, 6a or 7a), the comparator (e.g., 320, 620e or 720 in FIG. 3a, 6a or 7a) may comprise a positive terminal (e.g., 322, 622 or 722 in FIG. 3a, 6a or 7a) and a negative terminal (e.g., 324, 624 or 724 in FIG. 3a, 6a or 7a), and may quantize the combined signal by comparing signals at the positive terminal and the negative terminal, wherein the positive terminal may be coupled to the second node (e.g., n3b, n6b or n7b in FIG. 3a, 6a or 7a).

In an embodiment (e.g., FIG. 6a/6b), the ADC (e.g., 600 in FIG. 6a) may further convert a second sample (e.g., V[2*i+1] in FIG. 6b) of the input signal to a second sample (e.g., D[2*i+1] in FIG. 6b) of the output signal during a second cycle (e.g., U[i] in FIG. 6b). The ADC may further comprise a second comparator (e.g., 620o in FIG. 6a) coupled to the main circuit (e.g., 610), for quantizing a second combined signal to provide the second sample of the output signal. The main circuit (e.g., 610 in FIG. 6a) may further comprise a second capacitor array (e.g., Cs2) coupled to a fourth node (e.g., m6b), a third switch (e.g., ss6o) coupled between the first node (e.g., n6a) and the fourth node, and a fourth switch (e.g., sr6o) coupled between the fourth node and the third node (e.g., n6c). The second cycle (e.g., U[i] in FIG. 6b) may comprise a second sampling phase (e.g., Ua[i]). During the second sampling phase, the first switch may be off, the third switch may be on to conduct the first node to the fourth node, and the fourth switch may be off to stop conduction between the fourth node and the third node. Wherein the combining phase (e.g., Tf[i]) may occur during the second sampling phase (e.g., Ua[i]).

In an embodiment (e.g., FIG. 6a/6b), the auxiliary capacitor (e.g., Cr) may be variable to selectively provide a first capacitance (e.g., 1*C) and a different second capacitance (e.g., n*C). The cycle (e.g., T[i] in FIG. 6b) may further comprise a first scaling phase (e.g., Td[i]) after the comparison phase (e.g., Tc[i]). The second cycle (e.g., U[i]) may further comprise a second combining phase (e.g., Uf[i]), a second comparison phase (e.g., Uc[i]) and a third scaling phase (e.g., Ud[i]) after the second comparison phase. During the second combining phase, the first switch may be on, the second switch may be off, the third switch may be off to stop conduction between the first node and the fourth node, and the fourth switch may be on to conduct the fourth node to the third node, so the second combined signal may be formed at the fourth node. During the second comparison phase, the first switch may be on, the second switch may be off, the third switch may be off, the fourth switch may be on, the second comparator may be enabled to quantize the second combined signal and provide the second sample of the output signal, and the second capacitor array may receive a feedback of the output signal to form, at the fourth node, a second error signal reflecting a difference between the second combined signal and the output signal. During the comparison phase and the second comparison phase, the auxiliary capacitor may provide the first capacitance. During the first scaling phase (e.g., Td[i]), the first switch and the fourth switch may be off, the second switch and the third switch may be on, and the auxiliary capacitor may provide the second capacitance. During the third scaling phase (e.g., Ud[i]), the second switch and the third switch may be off, the first switch and the fourth switch may be on, and the auxiliary capacitor may provide the second capacitance.

In an embodiment (e.g., FIG. 6a/6b), the cycle (e.g., T[i] in FIG. 6b) may further comprise a second scaling phase (e.g., Tg[i]) between the combining phase (e.g., Tf[i]) and the comparison phase (e.g., Tc[i]). the second cycle (e.g., U)i]) may further comprise a fourth scaling phase (e.g., Ug[i]) between the second combining phase (e.g., Uf[i]) and the second comparison phase (e.g., Uc[i]). During the second scaling phase, the first switch and the fourth switch may be off, the second switch and the third switch may be on and the auxiliary capacitor may provide the first capacitance.

During the fourth scaling phase, the second switch and the third switch may be off, the first switch and the fourth switch may be on, and the auxiliary capacitor may provide the first capacitance.

In an embodiment (e.g., FIG. 6a/6b), the second comparator (e.g., 620o in FIG. 6a) may comprise a second positive terminal (e.g., 626) and a second negative terminal (e.g., 628), and may quantize the second combined signal by comparing signals at the second positive terminal and the second negative terminal. Wherein the second positive terminal may be coupled to the fourth node (e.g., m6b).

In an embodiment (e.g., FIG. 7a/7b/7c), the main circuit (e.g., 710 in FIG. 7a) may further comprise a second auxiliary capacitor (e.g., Cr2) coupled to a fourth node (e.g., n7d), and a third switch (e.g., sd7) coupled between the third node (e.g., n7c) and the fourth node. The cycle (e.g., T[i] in FIG. 7b/7c) may further comprise an additional phase (e.g., Th[i]) after the comparison phase (e.g., Tc[i]), the first scaling phase (e.g., Td[i]) and the second scaling phase (e.g., Te[i]). During the sampling phase (e.g., Ta[i]), the combining phase (e.g., Tb[i]) and the comparison phase (e.g., Tc[i]), the third switch may be off to stop conduction between the third node and the fourth node. During the additional phase (e.g., Th[i]), the first switch (e.g., ss7 in FIG. 7a) and the second switch (e.g., sr7) may be off, and the third switch (e.g., sd7) may be on to conduct the third node to the fourth node.

In an embodiment (FIG. 7a/7b/7c), the auxiliary capacitor (e.g., Cr) may be variable to selectively provide a first capacitance (e.g., 1*C in FIG. 7c) and a different second capacitance (e.g., n*C). The cycle (e.g., T[i] in FIG. 7b/7c) may further comprise a first scaling phase (e.g., Td[i]) between the comparison phase (e.g., Tc[i]) and the additional phase (e.g., Th[i]). During the comparison phase, the auxiliary capacitor may provide the first capacitance. During the first scaling phase, the first switch and the third switch may be off, the second switch may be on, and the auxiliary capacitor may provide the second capacitance. In an embodiment (FIG. 7a/7b/7c), the cycle (e.g., T[i] in FIG. 7b/7c) may further comprise a second scaling phase (e.g., Te[i]) between the first scaling phase (e.g., Td[i]) and the additional phase (e.g., Th[i]). During the second scaling phase, the first switch, the second switch and the third switch may all be off, and the auxiliary capacitor may provide the first capacitance.

An objective of the invention is providing an ADC (e.g., 300, 400, 600 or 700 in FIG. 3a, 4a, 6a or 7a) coupled to an input signal (e.g., V) at a first node (e.g., n3a, n4a, n6a or n7a in FIG. 3a, 4a, 6a or 7a), and converting a sample (e.g., V[i] in FIG. 3b, 5b or 7b, or V[2*i] in FIG. 6b) of the input signal to a sample (e.g., D[i] in FIG. 3b, 5b or 7b, or D[2*i] in FIG. 6b) of the output signal during a cycle (e.g., T[i] in FIG. 3b/3c, 4b, 5b/5c, 6b or 7b/7c). The ADC may comprise a comparator (e.g., 320, 420, 620e or 720 in FIG. 3a, 4a, 6a or 7a), a capacitor array (e.g., Cs in FIG. 3a, 4a, 6a or 7a) coupled to a second node (e.g., n3b, n4b, n6b or n7b in FIG. 3a, 4a, 6a or 7a), an auxiliary capacitor (e.g., Cr in FIG. 3a, 4a, 6a or 7a) coupled to a third node (e.g., n3c, n4c, n6c or n7c in FIG. 3a, 4a, 6a or 7a), a first switch (e.g., ss3, ss4, ss6e or ss7 in FIG. 3a, 4a, 6a or 7a) coupled between the first node and the second node, and a second switch (e.g., sr3, sr4, sr6e or sr7 in FIG. 3a, 4a, 6a or 7a) coupled between the second node and the third node. The cycle may comprise a sampling phase (e.g., Ta[i] in FIG. 3b/3c, 4b, 5b/5c, 6b or 7b/7c), a combining phase (e.g., Tb[i] in FIG. 3b/3c, 4b or 7b/7c, or Tf[i] in FIG. 5b/5c or 6b) and a comparison phase (e.g., Tc[i] in FIG. 3b/3c, 4b, 5b/5c, 6b or 7b/7c). During the sampling phase, the first switch may be on to conduct the first node to the second node, and the second switch may be off to stop conduction between the second node and the third node. During the combining phase, the first switch may be off to stop conduction between the first node and the second node, and the second switch may be on to conduct the third node to the second node, so the combined signal is formed at the second node. During the comparison phase, the first switch may be off, the second switch may be on, the comparator may be enabled to quantize the combined signal and provide the sample of the output signal, and the capacitor array may receive a feedback of the output signal to form an error signal at the second node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 8b illustrates an NTF (noise transfer function) of the ADC shown in FIG. 8a; and FIG. 9a to 9e respectively illustrate variable capacitors according to embodiments of the invention, which may be adopted to implement variable capacitor shown in FIG. 3a, 4a, 6a or 7a.

DETAILED DESCRIPTION OF PREFERRED EMBODIMENTS

Figure 1:
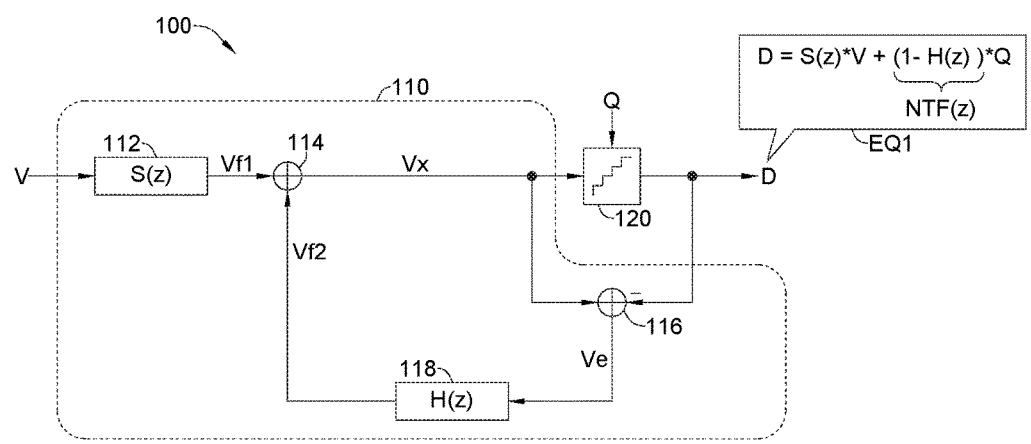
FIG. 1 illustrates an ADC according to an embodiment of the invention.

Please refer to FIG. 1 illustrating an ADC 100 according to an embodiment of the invention. The ADC 100 may convert an analog input signal V to a digital output signal D, and may include a main circuit 110 and a comparator 120 coupled to the main circuit 110. The main circuit 110 may transfer the input signal V by an input transfer block 112 to form a transferred input signal Vf1, filter an error signal Ve by a loop filter 118 to form a filtered error signal Vf2, and form a combined signal Vx by combining (as a sum unit 114) the transferred input signal Vf1 (output of the input transfer block 112) and the filtered error signal Vf2 (output of the loop filter 118). The comparator 120 may quantize the combined signal Vx to provide the output signal D. The error signal Ve may reflect a difference (result of a sum unit 116 with a minus sign for subtracting the signal D from the signal Vx) between the combined signal Vx and the output signal D.

By modeling noise (e.g., thermal noise, quantization noise and/or mismatch noise, etc.) as a noise signal Q added by the comparator 120, the output signal D may be expressed by an equation EQ1 shown in FIG. 1, with $S(z)$ and $H(z)$ respectively being transfer functions (in terms of z-transform) of the input transfer block 112 and the loop filter 118. As the equation EQ1 reveals, architecture arrangement of the ADC 100 may cause a noise transfer function $NTF(z)=(1-H(z))$ to be performed on the noise signal Q. The noise transfer function $NTF(z)$ may be designed to shape the noise signal Q away from desired frequency bands of the input signal V. The loop filter 118 with the transfer function $H(z)$ may be an FIR (Finite Impulse Response) or IIR (Infinite Impulse Response) filter.

Figure 2:
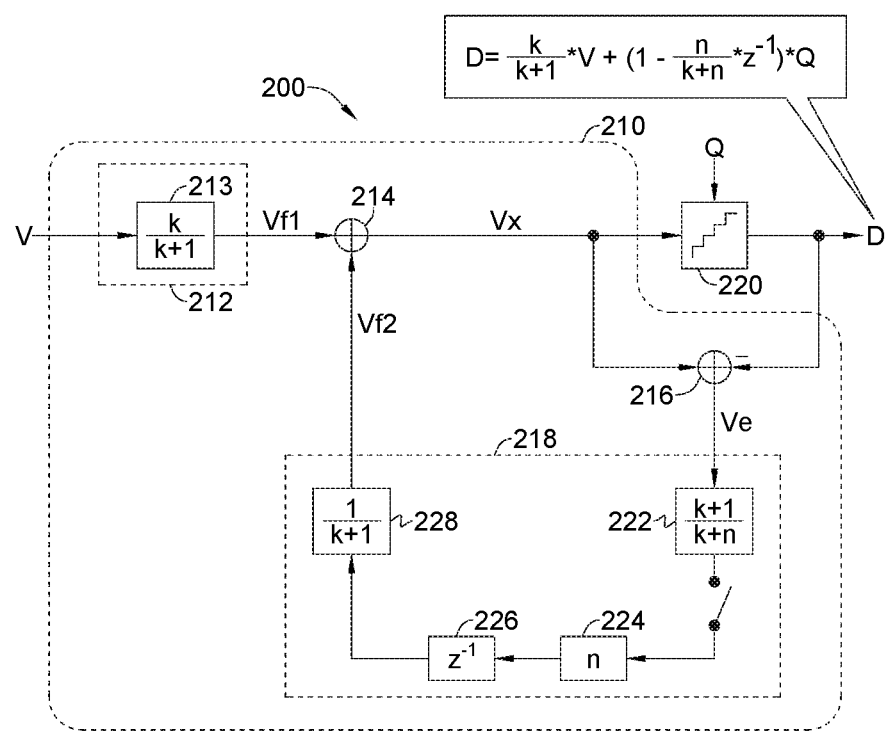
FIG. 2 illustrates an ADC according to an embodiment of the invention.

Please refer to FIG. 2 illustrating an ADC 200 according to an embodiment of the invention. The ADC 200 may convert an analog input signal V to a digital output signal D, and may include a main circuit 210 and a comparator 220 coupled to the main circuit 210. The main circuit 210 may transfer the input signal V by an input transfer block 212 to form a transferred input signal Vf1, filter an error signal Ve by a loop filter 218 to form a filtered error signal Vf2, and form a combined signal Vx by combining (as a sum unit 214) the transferred input signal Vf1 (result of the input transfer block 212) and the filtered error signal Vf2 (result of the loop filter 218). The comparator 220 may quantize the combined signal Vx to provide the output signal D. The error signal Ve may reflect a difference (result of a sum unit 216) between the combined signal Vx and the output signal D.

The input transfer block 212 may include an input scaling unit 213 for scaling the input signal V by a factor $k/(k+1)$. The loop filter 218 may include a delay unit 226 and loop scaling units 222, 224 and 228 for delaying and scaling the error signal Ve. The loop scaling units 222, 224 and 228 may respectively scale signals by factors $(k+1)/(k+n)$, $n$ and $1/(k+1)$, with factors $k$ and $n$ being two positive constants.

Figure 3A:
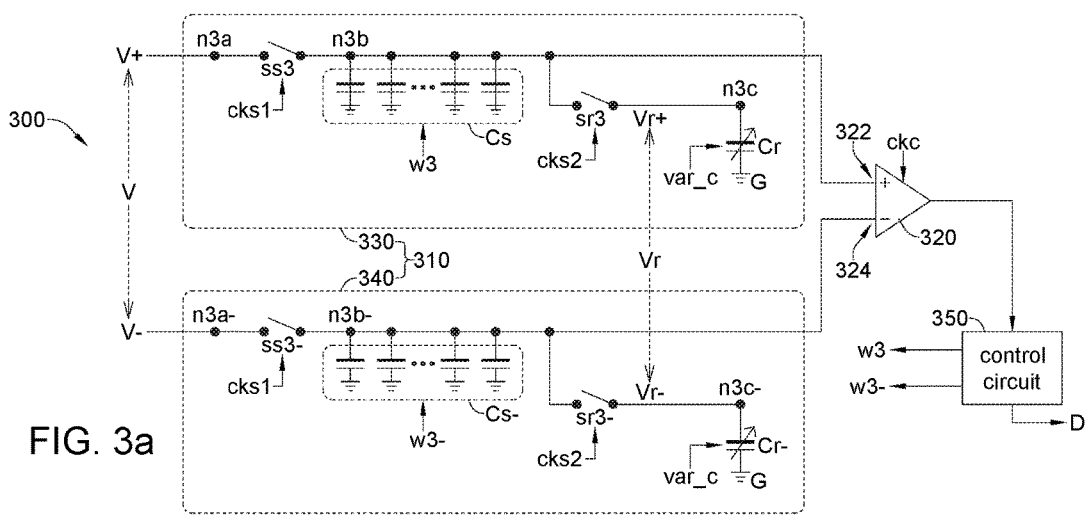
FIG. 3a illustrates an ADC according to an embodiment of the invention.
Figure 3B:
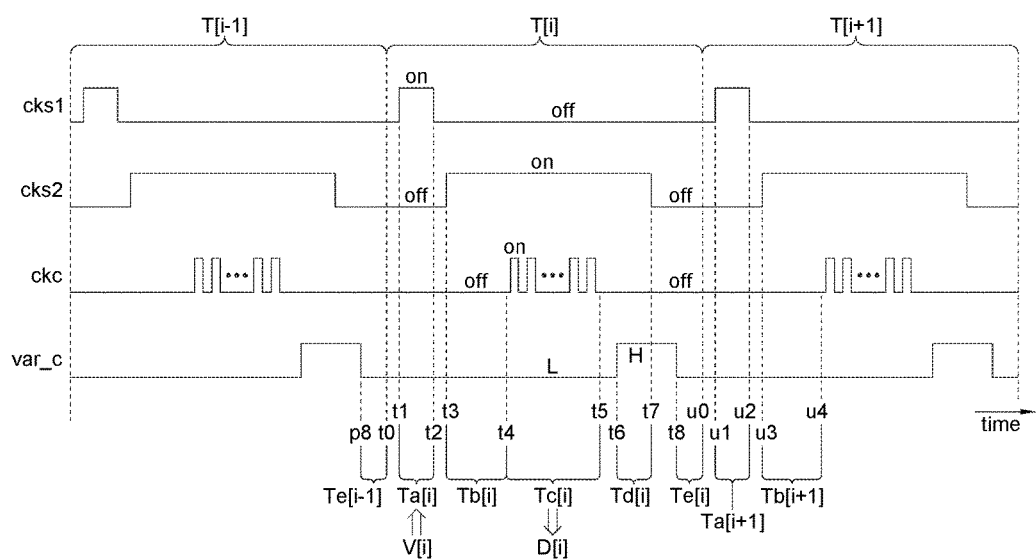
FIG. 3b illustrates operation timing according to an embodiment of the invention.
Figure 3C:
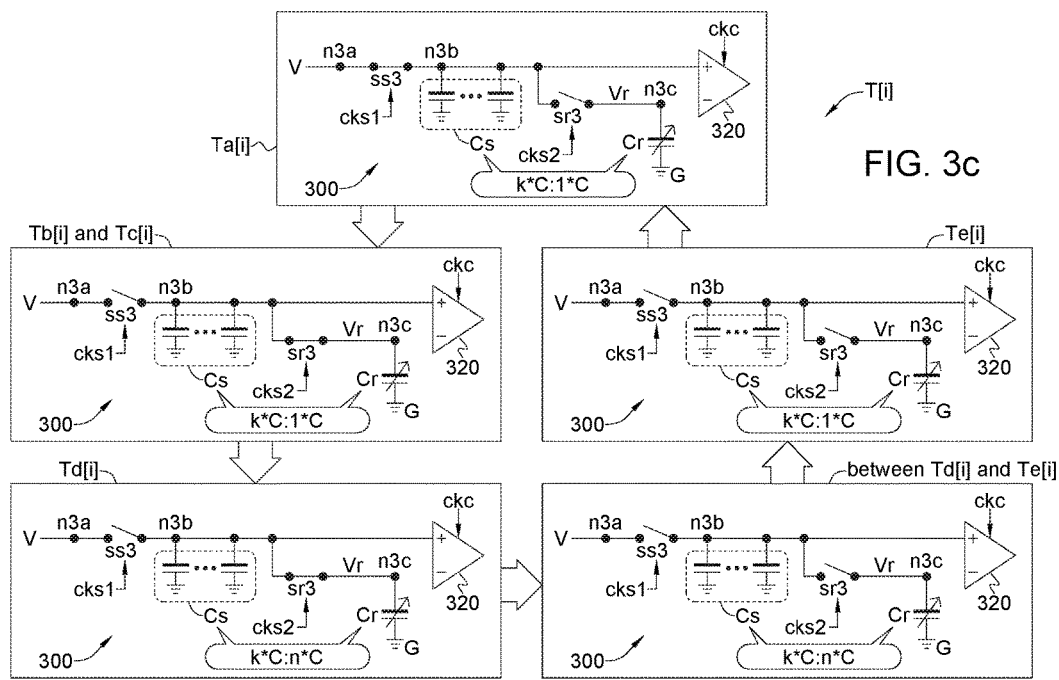
FIG. 3c illustrates operations of the ADC shown in FIG. 3a when operation timing in FIG. 3b is adopted.

Along with FIG. 2, please refer to FIGS. 3a, 3b, and 3c. FIG. 3a illustrates, according to an embodiment of the invention, an ADC 300 based on SAR (successive approximation register) ADC; FIG. 3b illustrates operation timing according to an embodiment of the invention, wherein the ADC 300 may adopt the timing shown in FIG. 3b to operate as shown in FIG. 3c. By the timing shown in FIG. 3b, the ADC 300 may implement the ADC 200 in FIG. 2 and convert an analog input signal V to a digital output signal D;

for example, convert a sample V[i] of the input signal V to a sample D[i] of the output signal D during a cycle T[i], as shown in FIG. 3b.

As shown in FIG. 3a, the input signal V may be a differential signal between two input signals V+ and V−. The ADC 300 may be coupled to the input signals V+ and V− at nodes n3a and n3a− respectively, and may include a main circuit 310, a comparator 320 and a control circuit 350. The comparator 320 may be controlled by a clock ckc, and include a positive terminal 322 and a negative terminal 324. When the clock ckc enables the comparator 320, the comparator 320 may compare signal levels (e.g., voltages) at the positive terminal 322 and the negative terminal 324, and generate a comparison result. The control circuit 350 may be coupled to an output terminal of the comparator 320, and may generate the output signal D by successively registering comparison results of the comparator 320; the control circuit 350 may also generate two control signals w3 and w3− in response to the comparison results of the comparator 320. The main circuit 310 may include two internal circuits 330 and 340, wherein the internal circuit 330 may be coupled between the input signal V+ and the positive terminal 322 of the comparator 320, and the internal circuit 340 may be coupled between the input signal V− and the negative terminal 324 of the comparator 320.

The internal circuit 330 may include a capacitor array Cs coupled to a node n3b, an auxiliary capacitor Cr coupled between nodes n3c and G (e.g., a ground node), a switch ss3 coupled between the nodes n3a and n3b, and a switch sr3 coupled between the nodes n3b and n3c. For example, the capacitor array Cs may include a number Nb of binary weighted capacitors, while the number Nb may be positively related to number of bits in each sample D[i] of the output signal D. In an embodiment, top plates of the capacitors in the capacitor array Cs may be commonly coupled to the node n3b, while voltages at bottom plates of the capacitors in the capacitor array Cs may be controlled by the control signal w3.

For the differential form of the input signal V, the internal circuit 340 may match the internal circuit 330, and may therefore include a capacitor array Cs− coupled to a node n3b−, an auxiliary capacitor Cr− coupled between a node n3c− and the node G, a switch ss3− coupled between the nodes n3a− and n3b−, and a switch sr3− coupled between the nodes n3b− and n3c−. For example, the capacitor array Cs− may include the same number Nb of binary weighted capacitors as the capacitor array Cs; in an embodiment, top plates of the capacitors in the capacitor array Cs− may be commonly coupled to the node n3b−, while voltages at bottom plates of the capacitors in the capacitor array Cs− may be controlled by the control signal w3−.

As shown in FIG. 3a, the positive terminal 322 of the comparator 320 may be coupled to the node n3b, and the negative terminal 324 of the comparator 320 may be coupled to the node n3b−. The switches ss3 and ss3− may be controlled by a same clock cks1. The switches sr3 and sr3− may be controlled by a same clock cks2. In an embodiment, the capacitor Cr may be variable to selectively provide a first capacitance 1*C and a different second capacitance n*C, with C a constant, wherein the factor n may be a constant greater than 1. Similarly, the capacitor Cr− may be variable to selectively provide the first capacitance 1*C and the different second capacitance n*C. The capacitors Cr and Cr− may be arranged to concurrently provide the same capacitance; capacitance of the capacitors Cr and Cr− may therefore be represented by a same signal var_c. A signal Vr+ at the node n3c and a signal Vr− at the node n3c− may form a differential signal Vr.

The circuitry shown in FIG. 3a is for a differential input signal V; however, ordinary skilled person may easily modify the circuitry for a single-end input signal V. For example, the single-end input signal V may be the input signal V+, with the input signal V− and the internal signal Vr− being constant ground signals, and the internal circuit 340 simplified to wiring conducting the negative terminal 324 of the comparator 320 to ground.

As shown in FIG. 3b, the cycle T[i] for converting the sample V[i] to the sample D[i] may start at time point t0 and end at time point u0. For the ADC 300 to operate according to the timing shown in FIG. 3b, within each cycle T[i], the switch ss3 may be on to conduct the node n3a to the node n3b from time points t1 to t2, and be off to stop conduction between the nodes n3a and n3b for the rest of the cycle T[i], as shown by timing of the clock cks1; i.e., the switch ss3 may remain off between time points t0 and t1, also remain off between time points t2 to u0. Similarly, the switch ss3− may be on to conduct the node n3a− to the node n3b− from time points t1 to t2, and remain off to stop conduction between the nodes n3a− and n3b− for the rest of the cycle T[i].

Within the cycle T[i], as shown by timing of the clock cks2, the switch sr3 may be on to conduct the node n3b to the node n3c from time points t3 to t7, and be off to stop conduction between the nodes n3b and n3c for the rest of the cycle T[i], i.e., remain off between time points t0 and t3, and between time points t3 to u0. Similarly, the switch sr3− may be on to conduct the node n3b− to the node n3c− from time points t3 to t7, and be off to stop conduction between the nodes n3b− and n3c− for the rest of the cycle T[i].

Within the cycle T[i], as shown by timing of the signal var_c, the capacitor Cr (and Cr−) may provide the capacitance n*C (denoted by "H") from time points t6 to t8, and provide the capacitance 1*C (denoted by "L") for the rest of the cycle T[i], i.e., provide the capacitance 1*C between time points t0 and t6, and between time points t8 and u0. It is noted that when the capacitor Cr (and Cr−) provides the capacitance n*C between time points t6 and t8, the switch sr3 (and sr3−) may transit from on to off at in-between time point t7.

According to timing of the clocks cks1, cks2 and the signal var_c, the cycle T[i] may be sectioned to include a sampling phase Ta[i] from time points t1 to t2, a combining phase Tb[i] from time points t3 to t4, a comparison phase Tc[i] from time points t4 to t5, a first scaling phase Td[i] from time points t6 to t7, and a second scaling phase Te[i] from time points t8 to u0, as shown in FIG. 3b.

For the ADC 300 to operate according to the timing shown in the FIG. 3b and implement the ADC 200 in FIG. 2, during the sampling phase Ta[i] (see also FIG. 3c in which the ADC 300 is illustrated in a simplified manner for clear demonstration without losing generality), the switch ss3 (and ss3−) may be on, the switch sr3 (and sr3−) may be off, and the capacitor Cr (and Cr−) may provide the capacitance 1*C. Thus, in the phase Ta[i], the input signal V may be sampled to the capacitor array Cs (and Cs−) as the sample V[i].

During the combining phase Tb[i] of the cycle T[i], the switch ss3 (and ss3−) may be off, the switch sr3 (and sr3−) may be on, the capacitor Cr (and Cr−) may provide the capacitance 1*C, while the capacitance of the capacitor array Cs (and Cs−) may be k*C. Thus, in the phase Tb[i], the sample V[i] of the input signal V stored in the capacitor array Cs (and Cs−) and a value Vr(t0) of the signal Vr stored in the capacitor Cr (and Cr−) may be linearly combined by charge sharing, and the signal Vr at the node n3c (and n3c−) may be updated to a value Vr(t4) to form the combined signal Vx in FIG. 2. In other words, during the combining phase Tb[i], the main circuit 310 may implement the input scaling unit 213 of the input transfer block 212 (FIG. 2) to scale the input signal V (the sample V[i]) by the factor k/(k+1), implement the loop scaling unit 228 to scale an output of the delay unit 226 (the value Vr(t0)) by the factor 1/(k+1), and implement the sum unit 214 to sum the scaled signals V[i]*k/(k+1) and Vr(t0)*1/(k+1) as the signal Vx=Vr (t4).

During the comparison phase Tc[i] of the cycle T[i], the switch ss3 (and ss3−) may remain off, the switch sr3 (and sr3−) may remain on, and the comparator 320 may be enabled multiple times by a sequence of pulses when the clock ckc is on, so the control circuit 350 may successively obtain and register bits of the sample D[i] respectively during the pulses, and may control voltages of the capacitor array Cs (and Cs−) by the signal w3 (and w3−) according to obtained bits of the sample D[i].

For example, after a first bit (e.g., MSB, most significant bit) of the sample D[i] is obtained, the control circuit 350 may register the first bit, and control voltages of the capacitor array Cs (and Cs−) by the signals w3 (and w3−) to subtract a first value, which reflects the first bit, from the signal Vr at the node n3c (and n3c−). In a subsequent pulse, the comparator 320 may compare to provide a second bit (e.g., a less significant bit) of the sample D[i], the control circuit 350 may register the second bit, and control voltages of the capacitor array Cs (and Cs−) by the signals w3 (and w3−) to further subtract a second value, which reflects the second bit, from the signal Vr. Successively, rest bits of the sample D[i] may be obtained one by one in each pulse. In a final pulse of the phase Tc[i], the control circuit 350 may register the last bit of the sample D[i], and control voltages of the capacitor array Cs (and Cs−) by the signals w3 (and w3−) to subtract a last value which reflects the last bit. Thus, when the phase Tc[i] ends at time point t5, the signal Vr may be updated from the value Vr(t4) to a value Vr(t5) by subtracting a feedback of the sample D[i] from the value Vr(t4). In other words, during the phase Tc[i], the comparator 320 may quantize the combined signal Vx=Vr(t4) and provide the sample D[i] of the output signal D, and the capacitor array Cs (and Cs−) may implement the sum unit 216 (FIG. 2) to receive feedback of the output signal D and form the error signal Ve=Vr(t5). It is noted that prior art SAR ADC will not subtract the last value reflecting the last bit from capacitor array.

During the scaling phase Td[i] of the cycle T[i], the switch ss3 (and ss3−) may remain off, the switch sr3 (and sr3−) may remain on, and the capacitor Cr (and Cr−) may transit from the capacitance 1*C to the capacitance n*C. Thus, the signal Vr at the node n3c (and n3c−) may be scaled by the factor (k+1)/(k+n) and be updated from the value Vr(t5) to a value Vr(t7). In other words, during the scaling phase Td[i], the main circuit 310 may implement the loop scaling unit 222 in FIG. 2 to scale the signal Ve=Vr(t5) by the factor (k+1)/(k+n). At time point t7, the switch sr3 (and sr3−) may transit to be off.

During the scaling phase Te[i] of the cycle T[i], the switch ss3 (and ss3−) may remain off, the switch sr3 (and sr3−) may remain off, and the capacitor Cr (and Cr−) may transit from the capacitance n*C to the capacitance n*C. Thus, the signal Vr at the node n3c (and n3c−) may be scaled by the factor n and be updated from the value Vr(t8) to a value Vr(u0). In other words, during the scaling phase Te[i], the main circuit 310 may implement the loop scaling unit 224 in FIG. 2.

After the scaling phase Te[i], because the switch sr3 (and sr3−) may be off, the value Vr(u0) may be stored in the capacitor Cr (and Cr−) to be delayed to a combining phase Tb[i+1] (between time points u3 and u4) of a subsequent cycle T[i+1]. Hence, for the cycle T[i+1], the value Vr(u0) to be combined in the combining phase Tb[i+1] is delayed from the previous cycle T[i]; similarly, for the cycle T[i], the value Vr(t0) combined with the sample V[i] in the combining phase Tb[i] is delayed from a scaling phase Te[i−1] (between time points p8 and t0) of a previous cycle T[i−1]. In other words, by keeping the switch sr3 (and sr3−) off from the scaling phase Te[i] to time point u3 before the subsequent combining phase Tb[i+1], the main circuit 310 may implement the delay unit 226 in FIG. 2.

Figure 4A:
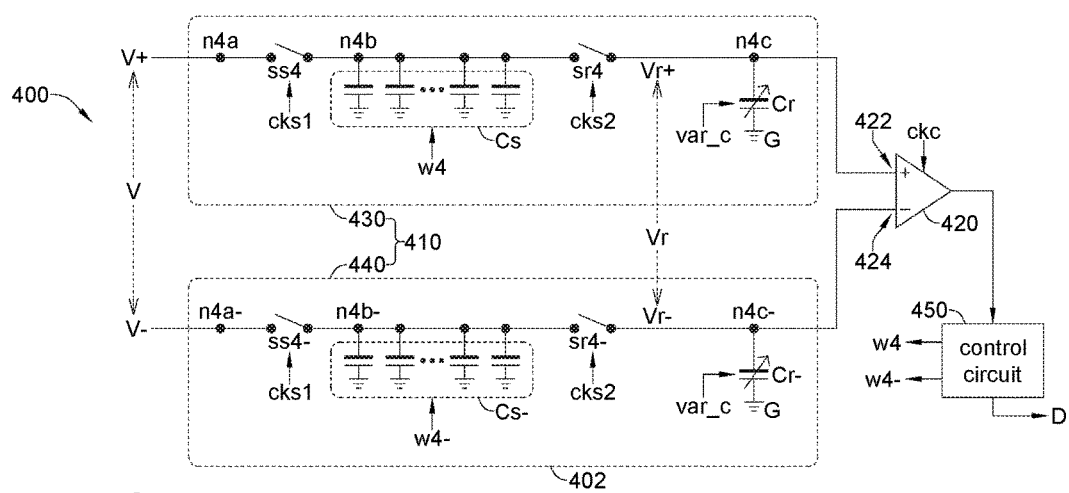
FIG. 4a illustrates an ADC according to an embodiment of the invention.
Figure 4B:
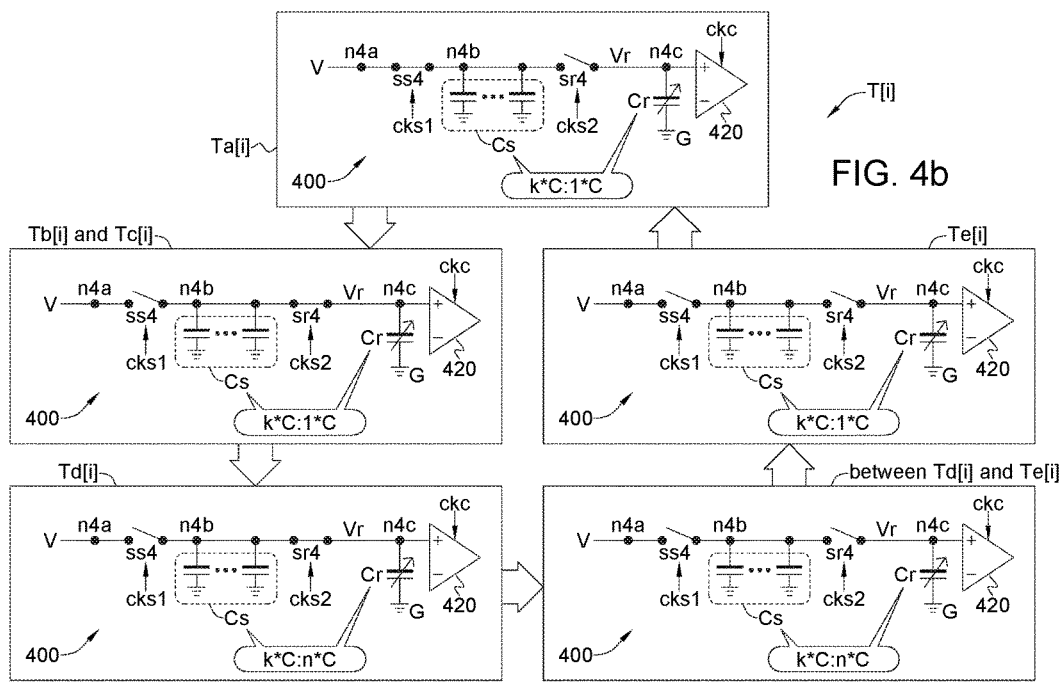
FIG. 4b illustrates operations of the ADC shown in FIG. 4a when operation timing in FIG. 3b is adopted.

Along with FIG. 2, please refer to FIGS. 4a and 4b. FIG. 4a illustrates an ADC 400 according to an embodiment of the invention. The ADC 400 may adopt the timing shown in FIG. 3b, and accordingly operate as shown in FIG. 4b to implement the ADC 200 shown in FIG. 2. As shown in FIG. 4a, the ADC 400 may convert an analog input signal V to a digital output signal D; for example, as shown in FIG. 3b, the ADC 400 may convert a sample V[i] of the input signal V to a sample D[i] of the output signal D during a cycle T[i].

As shown in FIG. 4a, the input signal V may be a differential signal between two input signals V+ and V−. The ADC 400 may be coupled to the input signals V+ and V− at nodes n4a and n4a−, and may include a main circuit 410, a comparator 420 and a control circuit 450. The comparator 420 may be controlled by a clock ckc, and include a positive terminal 422 and a negative terminal 424. When the clock ckc enables the comparator 420, the comparator 420 may compare signal levels (e.g., voltages) at the positive terminal 422 and the negative terminal 424, and accordingly generate a comparison result. The control circuit 450 may be coupled to an output terminal of the comparator 420, and may generate the output signal D by successively registering comparison results of the comparator 420; the control circuit 450 may also generate two control signals w4 and w4− in response to the comparison results of the comparator 420. The main circuit 410 may include two internal circuits 430 and 440, wherein the internal circuit 430 may be coupled between the input signal V+ and the positive terminal 422 of the comparator 420, and the internal circuit 440 may be coupled between the input signal V− and the negative terminal 424 of the comparator 420.

The internal circuit 430 may include a capacitor array Cs coupled to a node n4b, an auxiliary capacitor Cr coupled between nodes n4c and G, a switch ss4 coupled between the nodes n4a and n4b, and a switch sr4 coupled between the nodes n4b and n4c. For example, the capacitor array Cs may include a number Nb of binary weighted capacitors; in an embodiment, top plates of the capacitors in the capacitor array Cs may be commonly coupled to the node n4b, while voltages at bottom plates of the capacitors in the capacitor array Cs may be controlled by the control signal w4.

For the differential form of the input signal V, the internal circuit 440 may match the internal circuit 430, and may therefore include a capacitor array Cs− coupled to a node n4b−, an auxiliary capacitor Cr− coupled between a node n4c− and the node G, a switch ss4− coupled between the nodes n4a− and n4b−, and a switch sr4− coupled between the nodes n4b− and n4c−. For example, the capacitor array Cs− may include the same number Nb of binary weighted capacitors as the capacitor array Cs; in an embodiment, top plates of the capacitors in the capacitor array Cs− may be commonly coupled to the node n4b−, while voltages at bottom plates of the capacitors in the capacitor array Cs− may be controlled by the control signal w4−.

As shown in FIG. 4a, the positive terminal 422 of the comparator 420 may be coupled to the node n4c, and the negative terminal 424 of the comparator 420 may be coupled to the node n4c−. The switches ss4 and ss4− may be controlled by a same clock cks1. The switches sr4 and sr4− may be controlled by a same clock cks2. In an embodiment, the capacitor Cr may be variable to selectively provide a first capacitance 1*C and a different second capacitance n*C, with C a constant. Similarly, the capacitor Cr− may be variable to selectively provide the first capacitance 1*C and the different second capacitance n*C. Capacitance of the capacitors Cr and Cr− may be represented by a same signal var_c. A signal Vr+ at the node n4c and a signal Vr− at the node n4c− may form a differential signal Vr. The circuitry shown in FIG. 4a is for a differential input signal V; however, ordinary skilled person may easily modify the circuitry for a single-end input signal V.

For the ADC 400 to operate according to the timing shown in FIG. 3b, within each cycle T[i], as shown by timing of the clock cks1, the switch ss4 may be on to conduct the nodes n4a to n4b from time points t1 to t2, and be off to stop conduction between the nodes n4a and n4b from time points t0 to t1, also from time points t2 to u0. Similarly, the switch ss4− may be on to conduct the node n4a− to the node n4b− from time points t1 to t2, and remain off to stop conduction between the nodes n4a− and n4b− for the rest of the cycle T[i].

Within the cycle T[i], as shown by timing of the clock cks2, the switch sr4 may be on to conduct the node n4b to the node n4c from time points t3 to t7, and be off to stop conduction between the nodes n4b and n4c from time points t0 to t3, also from time points t7 to u0. Similarly, the switch sr4− may be on to conduct the node n4b− to the node n4c− from time points t3 to t7, and be off to stop conduction between the nodes n4b− and n4c− for the rest of the cycle T[i].

Within the cycle T[i], as shown by timing of the signal var_c, the capacitor Cr (and Cr−) may provide the capacitance n*C (denoted by "H") from time points t6 to t8, and provide the capacitance 1*C (denoted by "L") for the rest of the cycle T[i], i.e., between time points t0 and t6, and between time points t8 and u0.

As previously described, according to timing of the clocks cks1, cks2 and the signal var_c, the cycle T[i] may include the sampling phase Ta[i] from time points t1 to t2, the combining phase Tb[i] from time points t3 to t4, the comparison phase Tc[i] from time points t4 to t5, the first scaling phase Td[i] from time points t6 to t7, and the second scaling phase Te[i] from time points t8 to u0, as shown in FIG. 3b.

For the ADC 400 to operate according to the timing shown in the FIG. 3b and implement the ADC 200 in FIG. 2, during the sampling phase Ta[i](see also FIG. 4b in which the ADC 400 is illustrated in a simplified manner for clear demonstration without losing generality), the switch ss4 (and ss4−) may be on, the switch sr4 (and sr4−) may be off, and the capacitor Cr (and Cr−) may provide the capacitance 1*C. Thus, in the phase Ta[i], the input signal V may be sampled to the capacitor array Cs (and Cs−) as the sample V[i].

During the combining phase Tb[i] of the cycle T[i], the switch ss4 (and ss4−) may be off, the switch sr4 (and sr4−) may be on, the capacitor Cr (and Cr−) may provide the capacitance 1*C, while the capacitance of the capacitor array Cs (and Cs−) may be k*C. Thus, in the phase Tb[i], the sample V[i] of the input signal V stored in the capacitor array Cs (and Cs−) and a value Vr(t0) of the signal Vr stored in the capacitor Cr may be linearly combined by charge sharing, and the signal Vr at the node n4c (and n4c−) may be updated to a value Vr(t4) to form the combined signal Vx in FIG. 2. In other words, during the combining phase Tb[i], the main circuit 410 may implement the input scaling unit 213 of the input transfer block 212 (FIG. 2) to scale the input signal V (the sample V[i]) by the factor k/(k+1), implement the loop scaling unit 228 to scale an output of the delay unit 226 (the value Vr(t0)) by the factor 1/(k+1), and implement the sum unit 214 to sum up the scaled signals V[i]*k/(k+1) and Vr(t0)*1/(k+1) and form the signal Vx=Vr(t4).

During the comparison phase Tc[i] of the cycle T[i], the switch ss4 (and ss4−) may remain off, the switch sr4 (and sr4−) may remain on, and the comparator 420 may be enabled multiple times by a sequence of pulses when the clock ckc is on, so the control circuit 450 may successively obtain and register bits of the sample D[i] respectively during the pulses, and may control voltages of the capacitor array Cs (and Cs−) by the signal w4 (and w4−) according to obtained bits of the sample D[i].

For example, after a first bit (e.g., MSB, most significant bit) of the sample D[i] is obtained, the control circuit 450 may register the first bit, and control voltages of the capacitor array Cs (and Cs−) by the signals w4 (and w4−) to subtracting a first value, which reflects the first bit, from the signal at the node n3b (and n3b−). In subsequent pulses, the comparator 320 may successively perform a serial of comparisons to provide rest bits of the sample D[i], the control circuit 450 may register the those bits, and control voltages of the capacitor array Cs (and Cs−) by the signals w4 (and w4−) to further subtracting values reflecting those bits. Thus, when the phase Tc[i] ends at time point t5, the signal Vr may be updated from the value Vr(t4) to a value Vr(t5) by subtracting a feedback of the sample D[i] from the value Vr(t4). In other words, during the phase Tc[i], the comparator 420 may quantize the combined signal Vx=Vr(t4) and provide the sample D[i] of the output signal D, and the capacitor array Cs (and Cs−) may implement the sum unit 216 (FIG. 2) to receive feedback of the output signal D and form the error signal Ve=Vr(t5).

During the scaling phase Td[i] of the cycle T[i], the switch ss4 (and ss4−) may remain off, the switch sr4 (and sr4−) may remain on, and the capacitor Cr (and Cr−) may transit from the capacitance 1*C to the capacitance n*C. Thus, the signal Vr at the node n4c (and n4c−) may be scaled by the factor (k+1)/(k+n) and be updated from the value Vr(t5) to a value Vr(t7). In other words, during the scaling phase Td[i], the main circuit 410 may implement the loop scaling unit 222 in FIG. 2 to scale the signal Ve=Vr(t5) by the factor (k+1)/(k+n). At time point t7, the switch sr4 (and sr4−) may transit to off.

During the scaling phase Te[i] of the cycle T[i], the switch ss4 (and ss4−) may remain off, the switch sr4 (and sr4−) may remain off, and the capacitor Cr (and Cr−) may transit from the capacitance n*C to the capacitance 1*C. Thus, the signal Vr at the node n4c (and n4c−) may be scaled by the factor n and be updated from the value Vr(t7) to a value Vr(u0). In other words, during the scaling phase Te[i], the main circuit 410 may implement the loop scaling unit 224 in FIG. 2.

After the scaling phase Te[i], because the switch sr4 (and sr4−) may be off, the value Vr(u0) may be stored in the capacitor Cr (and Cr−) to be delayed to the combining phase Tb[i+1] of the subsequent cycle T[i+1]. Hence, for the cycle T[i+1], the value Vr(u0) to be combined in the combining phase Tb[i+1] is delayed from the cycle T[i]; similarly, for the cycle T[i], the value Vr(t0) combined with the sample V[i] in the combining phase Tb[i] is delayed from the scaling phase Te[i−1] of the previous cycle T[i−1]. In other words, by keeping the switch sr4 (and sr4−) off from the scaling phase Te[i] to time point u3 before the subsequent combining phase Tb[i+1], the main circuit 410 may implement the delay unit 226 in FIG. 2.

Figure 5A:
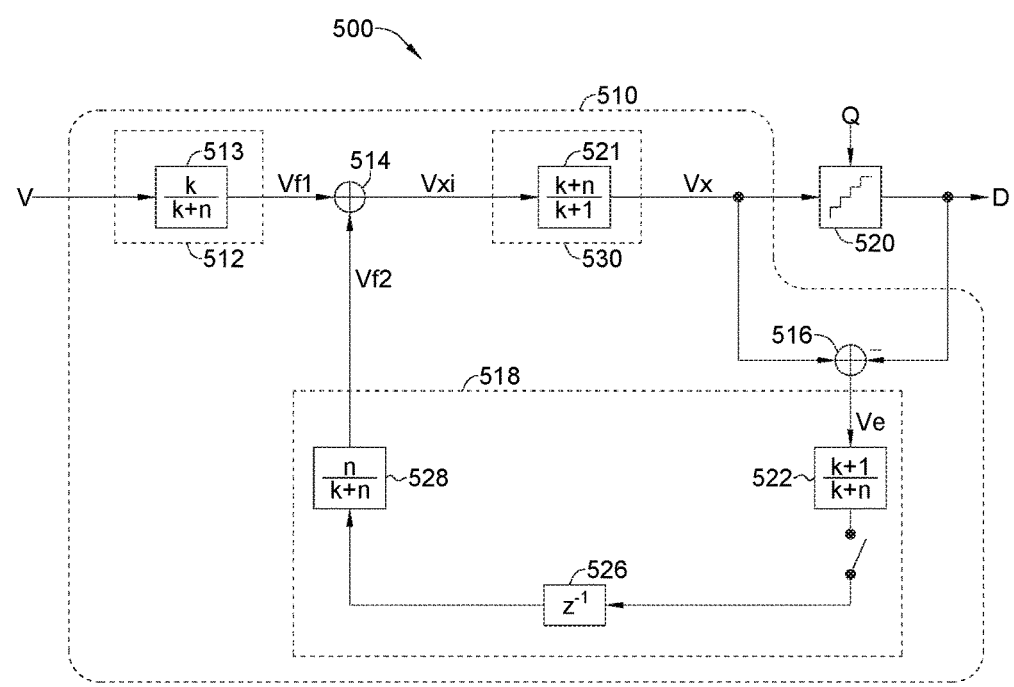
FIG. 5a illustrates an ADC according to an embodiment of the invention.
Figure 5B:
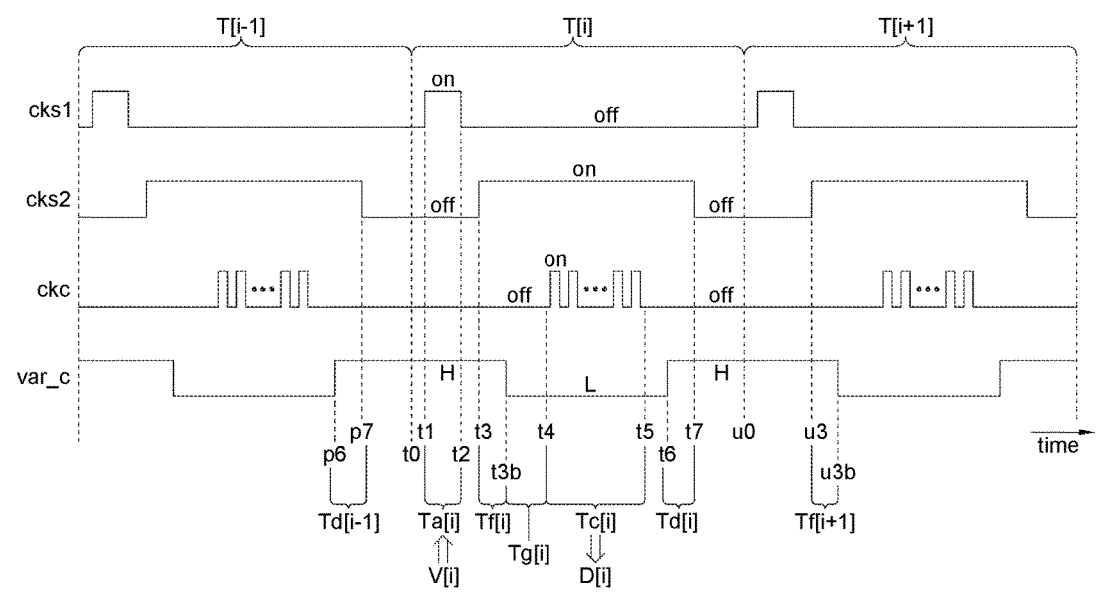
FIG. 5b illustrates operation timing according to an embodiment of the invention.
Figure 5C:
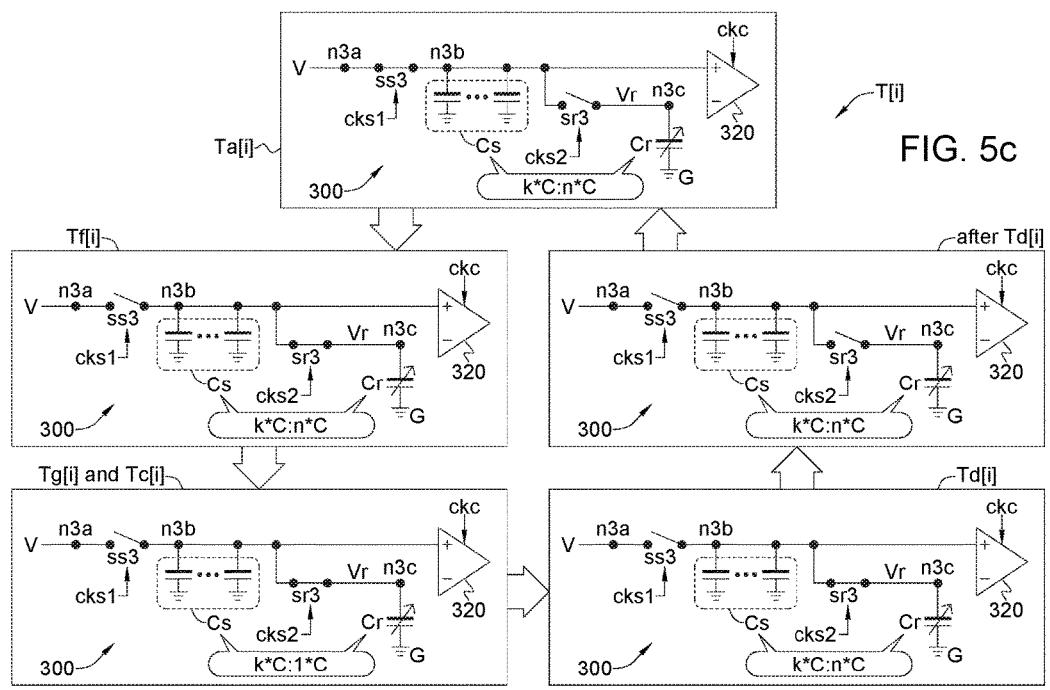
FIG. 5c illustrates operations of the ADC shown in FIG. 3a when the operation timing in FIG. 5b is adopted.

Both the ADC 300 in FIG. 3a and the ADC 400 in FIG. 4a may adopt the operation timing shown in FIG. 3b to implement the ADC 200 in FIG. 2. Please refer to FIGS. 5a, 5b and 5c. FIG. 5a illustrates an ADC 500 according to an embodiment of the invention, FIG. 5b illustrates operation timing according to an embodiment of the invention, wherein both the ADC 300 in FIG. 3a and the ADC 400 in FIG. 4a may adopt the operation timing shown in FIG. 5b to implement the ADC 500 in FIG. 5a. For example, the ADC 300 in FIG. 3a may adopt the timing shown in FIG. 5b to operate as shown in FIG. 5c.

The ADC 500 shown in FIG. 5a may convert an analog input signal V to a digital output signal D, and may include a main circuit 510 and a comparator 520 coupled to the main circuit 510. The main circuit 510 may transfer the input signal V by an input transfer block 512 to form a transferred input signal Vf1, filter an error signal Ve by a loop filter 518 to form a filtered error signal Vf2, and form a combined signal Vx by linearly combining (by a sum unit 514) the transferred input signal Vf1 and the filtered error signal Vf2 to form a combined signal Vxi, and transferring the combined signal Vxi by a forward transfer block 530. The comparator 520 may quantize the combined signal Vx to provide the output signal D. The error signal Ve may reflect a difference (modeled by a sum unit 516) between the combined signal Vx and the output signal D.

The input transfer block 512 may include an input scaling unit 513 for scaling the input signal V by a factor k/(k+n). The forward transfer block 530 may include a scaling unit 521 for scaling the combined signal Vxi by a factor (k+n)/(k+1). The loop filter 518 may include a delay unit 526 and loop scaling units 522 and 528 for delaying and scaling the error signal Ve. The loop scaling units 522 and 528 may respectively scale signals by factors (k+1)/(k+n) and n/(k+n), with factors k and n being two positive constants.

By the timing shown in FIG. 5b, the ADC 300 (FIG. 3a) or 400 (FIG. 4a) may implement the ADC 500 (FIG. 5a) to convert an analog input signal V to a digital output signal D; for example, convert a sample V[i] of the input signal V to a sample D[i] of the output signal D during a cycle T[i].

As shown in FIG. 5b, the cycle T[i] for converting the sample D[i] to the sample V[i] may start at time point t0 and end at time point u0. For the ADC 300 or 400 to operate according to the timing shown in FIG. 5b, within each cycle T[i], the switch ss3 (and ss3−, or ss4 and ss4−) may be on from time points t1 to t2, and be off for the rest of the cycle T[i], as shown by timing of the clock cks1. Within the cycle T[i], as shown by timing of the clock cks2, the switch sr3 (and sr3−, or sr4 and sr4−) may be on from time points t3 to t7, and be off for the rest of the cycle T[i]. Within the cycle T[i], as shown by timing of the signal var_c, the capacitor Cr (and Cr−) may provide the capacitance n*C (denoted by "H") from time points t0 to t3b and from time points t6 to u0, and provide the capacitance 1*C (denoted by "L") from time points t3b to t6.

According to timing of the clocks cks1, cks2 and the signal var_c shown in FIG. 5b, the cycle T[i] may be sectioned to include a sampling phase Ta[i] from time points t1 to t2, a combining phase Tf[i] from time points t3 to t3b, a scaling phase Tg[i] from time points t3b to t4, a comparison phase Tc[i] from time points t4 to t5, and another scaling phase Td[i] from time points t6 to t7.

For the ADC 300 (or 400) to operate according to the timing shown in the FIG. 5b and implement the ADC 500 in FIG. 5a, during the sampling phase Ta[i] (see also FIG. 5c in which the ADC 300 is illustrated in a simplified manner for clear demonstration without losing generality), the switch ss3 (and ss3−) may be on, the switch sr3 (and sr3−) may be off, and the capacitor Cr (and Cr−) may provide the capacitance n*C. Thus, in the phase Ta[i], the input signal V may be sampled to the capacitor array Cs (and Cs−) as the sample V[i]. At time point t3, the switch sr3 (and sr3−) may transit from off to on.

During the combining phase Tf[i] of the cycle T[i], the switch ss3 (and ss3−) may be off, the switch sr3 (and sr3−) may be on, the capacitor Cr (and Cr−) may keep providing the capacitance n*C, while the capacitance of the capacitor array Cs (and Cs−) may be k*C. Thus, in the phase Tf[i], the sample V[i] of the input signal V stored in the capacitor array Cs (and Cs−) and a value Vr(p7) of the signal Vr stored in the capacitor Cr may be linearly combined by charge sharing, and the signal Vr at the node n3c (and n3c−) may be updated to a value Vr(t3b) to form the combined signal Vxi in FIG. 5a. In other words, during the combining phase Tf[i], the main circuit 310 may implement the input scaling unit 513 of the input transfer block 512 (FIG. 5a) to scale the input signal V (the sample V[i]) by the factor k/(k+n), implement the loop scaling unit 528 to scale an output of the delay unit 526 (the value Vr(p7)) by the factor n/(k+n), and implement the sum unit 514 to sum the scaled signals V[i]*k/(k+n) and Vr(p7)*n/(k+n) to form the signal Vxi=Vr(t3b). At time point t3b, the capacitor Cr (and Cr−) may transit from the capacitance n*C to the capacitance 1*C.

During the scaling phase Tg[i] of the cycle T[i], the switch ss3 (and ss3−) may remain off, the switch sr3 (and sr3−) may remain on, and the capacitor Cr (and Cr−) may provide the capacitance 1*C. Thus, the signal Vr at the node n3c (and n3c−) may be scaled by the factor (k+n)/(k+1) and be updated from the value Vr(t3b) to a value Vr(t4). In other words, during the scaling phase Tg[i], the main circuit 310 may implement the forward scaling unit 521 in FIG. 5a to scale the signal Vxi=Vr(t3b) by the factor (k+n)/(k+1), and form the signal Vx=Vr(t4).

During the comparison phase Tc[i] of the cycle T[i], the switch ss3 (and ss3−) may remain off, the switch sr3 (and sr3−) may remain on, and the comparator 320 may be enabled multiple times by a sequence of pulses when the clock ckc is on, so the control circuit 350 may successively obtain and register bits of the sample D[i] respectively during the pulses, and may control voltages of the capacitor array Cs (and Cs−) by the signal w3 (and w3−) according to obtained bits of the sample D[i]. Thus, when the phase Tc[i] ends at time point t5, the signal Vr may be updated from the value Vr(t4) to a value Vr(t5) by subtracting a feedback of the sample D[i] from the value Vr(t4). In other words, during the phase Tc[i], the comparator 320 may quantize the combined signal Vx=Vr(t4) and provide the sample D[i] of the output signal D, and the capacitor array Cs (and Cs−) may implement the sum unit 216 (FIG. 2) to receive feedback of the output signal D and form the error signal Ve=Vr(t5). At time point t6, the capacitor Cr (and Cr−) may transit from the capacitance 1*C to the capacitance n*C.

During the scaling phase Td[i] of the cycle T[i], the switch ss3 (and ss3−) may remain off, the switch sr3 (and sr3−) may remain on, and the capacitor Cr (and Cr−) may provide the capacitance n*C. Thus, the signal Vr at the node n3c (and n3c−) may be scaled by the factor (k+1)/(k+n) and be updated from the value Vr(t5) to a value Vr(t7). In other words, during the scaling phase Td[i], the main circuit 310 may implement the loop scaling unit 522 in FIG. 5*a* to scale the signal Ve=Vr(t5) by the factor (k+1)/(k+n).

After the scaling phase Td[i], because the switch sr3 (and sr3−) may be off, the value Vr(t7) may be stored in the capacitor Cr (and Cr−) to be delayed to a combining phase Tf[i+1] (between time points u3 and u3*b*) of a subsequent cycle T[i+1]. Hence, for the cycle T[i+1], the value Vr(t7) to be combined in the combining phase Tf[i+1] is delayed from the cycle T[i]; similarly, for the cycle T[i], the value Vr(p7) combined with the sample V[i] in the combining phase Tf[i] is delayed from a scaling phase Td[i−1] (between time points p6 and p7) of a previous cycle T[i−1]. In other words, by keeping the switch sr3 (and sr3−) off from time point t7 (after the scaling phase Td[i]) to time point u3 (before the subsequent combining phase Tf[i+1]), the main circuit 310 may implement the delay unit 526 in FIG. 5*a*.

Comparing the ADC 200 in FIG. 2 and the ADC 500 in FIG. 5*a*, it is noted that the scaling unit 521 may compensate lower scaling factors of the input transfer block 512 and the loop filter 518, thus the ADC 500 may achieve the same transfer function as the ADC 200.

Figure 6A:
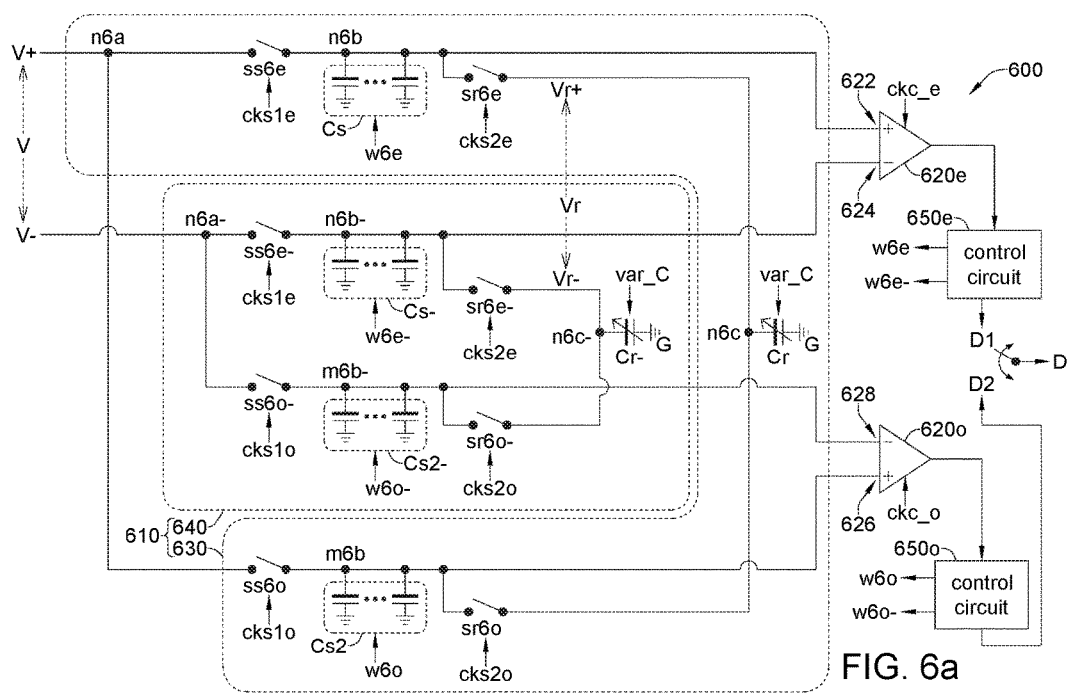
FIG. 6a illustrates an ADC according to an embodiment of the invention.
Figure 6B:
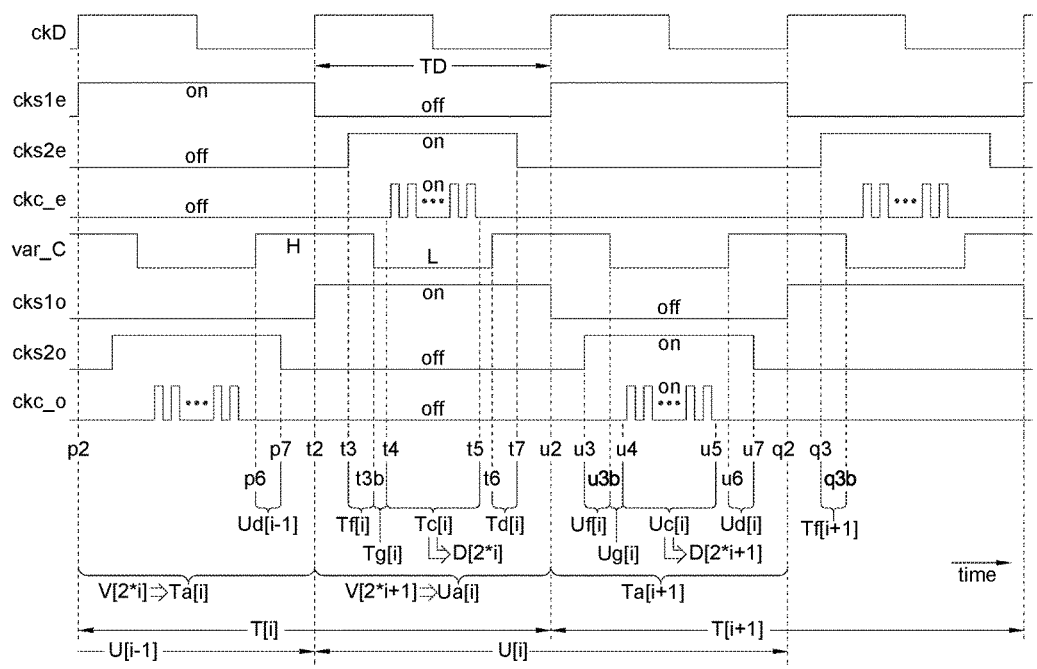
FIG. 6b illustrates, according to an embodiment of the invention, operation timing which the ADC in FIG. 6a may adopt.

Please refer to FIGS. 6*a* and 6*b*; FIG. 6*a* illustrates an ADC 600 according to an embodiment of the invention, and FIG. 6*a* illustrates operation timing of the ADC 600. As shown in FIG. 6*a*, the ADC 600 may convert an input signal V to an output signal D, and may include a main circuit 610, two comparators 620*e* and 620*o* coupled to the main circuit 610, and two control circuits 650*e* and 650*o*. For example, the input signal V may be a differential signal between two input signals V+ and V−. The ADC 600 may be coupled to the input signals V+ and V− at nodes n6*a* and n6*a*−.

The comparator 620*e* may be controlled by a clock ckc_e, and include a positive terminal 622 and a negative terminal 624. When the clock ckc_e enables the comparator 620*e*, the comparator 620*e* may compare signal levels (e.g., voltages) at the positive terminal 622 and the negative terminal 624, and accordingly generate a comparison result. The control circuit 650*e* may be coupled to an output terminal of the comparator 620*e*, and may generate an output signal D1 by successively registering comparison results of the comparator 620*e*; the control circuit 650*e* may also generate two control signals w6*e* and w6*e*− in response to the comparison results of the comparator 620*e*. The comparator 620*o* may be controlled by a clock ckc_o, and include a positive terminal 626 and a negative terminal 628. When the clock ckc_o enables the comparator 620*o*, the comparator 620*o* may compare signal levels (e.g., voltages) at the positive terminal 626 and the negative terminal 628, and accordingly generate a comparison result. The control circuit 650*o* may be coupled to an output terminal of the comparator 620*o*, and may generate an output signal D2 by successively registering comparison results of the comparator 620*o*; the control circuit 650*o* may also generate two control signals w6*o* and w6*o*− in response to the comparison results of the comparator 620*o*. The ADC 600 may alternately output the signals D1 and D2 as the output signal D; for example, output a sample D1 [i] of the signal D1 as a sample D[2*i] of the signal D, and output a sample D2[i] of the signal D2 as a sample D[2*i+1] of the signal D.

The main circuit 610 may include two internal circuits 630 and 640. The internal circuit 630 may include a capacitor array Cs coupled to a node n6*b*, a capacitor array Cs2 coupled to a node m6*b*, an auxiliary capacitor Cr coupled between nodes n6*c* and G, a switch ss6*e* coupled between the nodes n6*a* and n6*b*, a switch ss6*o* coupled between the nodes n6*a* and m6*b*, a switch sr6*e* coupled between the nodes n6*b* and n6*c*, and a switch sr6*o* coupled between the nodes m6*b* and n6*c*. For example, the capacitor arrays Cs and Cs2 may be substantially matched, each of them may include a number Nb of binary weighted capacitors, while the number Nb is positively related to number of bits in each sample of the output signal D; in an embodiment, top plates of the capacitors in the capacitor array Cs may be commonly coupled to the node n6*b*, while voltages at bottom plates of the capacitors in the capacitor array Cs may be controlled by the control signal w6*e*; similarly, top plates of the capacitors in the capacitor array Cs2 may be commonly coupled to the node m6*b*, while voltages at bottom plates of the capacitors in the capacitor array Cs2 may be controlled by the control signal w6*o*.

For the differential form of the input signal V, the internal circuit 640 may match the internal circuit 630, and may therefore include a capacitor array Cs− coupled to a node n6*b*−, a capacitor array Cs2− coupled to a node m6*b*−, an auxiliary capacitor Cr− coupled between a node n6*c*− and the node G, a switch ss6*e*− coupled between the nodes n6*a*− and n6*b*−, a switch ss6*o*− coupled between the nodes n6*a*− and m6*b*−, a switch sr6*e*− coupled between the nodes n6*b*− and n6*c*−, and a switch sr6*o*− coupled between the nodes m6*b*− and n6*c*−. For example, the capacitor arrays Cs− and Cs2− as well as the capacitor array Cs and Cs2 may be substantially matched, each of them may include the same number Nb of binary weighted capacitors; in an embodiment, top plates of the capacitors in the capacitor array Cs− may be commonly coupled to the node n6*b*−, while voltages at bottom plates of the capacitors in the capacitor array Cs− may be controlled by the control signal w6*e*−; similarly, top plates of the capacitors in the capacitor array Cs2− may be commonly coupled to the node m6*b*−, while voltages at bottom plates of the capacitors in the capacitor array Cs2− may be controlled by the control signal w6*o*−. A signal Vr+ at the node n6*c* and a signal Vr− at the node n6*c*− may form a differential signal Vr.

As shown in FIG. 6*a*, the positive terminal 622 of the comparator 620*e* may be coupled to the node n6*b*, and the negative terminal 624 of the comparator 620*e* may be coupled to the node n6*b*−. On the other hand, the positive terminal 626 of the comparator 620*o* may be coupled to the node m6*b*, and the negative terminal 628 of the comparator 620*o* may be coupled to the node m6*b*−.

The switches ss6*e* and ss6*e*− may be controlled by a same clock cks1*e*. The switches sr6*e* and sr6*e*− may be controlled by a same clock cks2*e*. The switches ss6*o* and ss6*o*− may be controlled by a same clock cks1*o*. The switches sr6*o* and sr6*o*− may be controlled by a same clock cks2*o*.

In an embodiment, the capacitor Cr may be variable to selectively provide a first capacitance 1*C and a different second capacitance n*C, with C a constant. Similarly, the capacitor Cr− may be variable to selectively provide the first capacitance 1*C and the different second capacitance n*C. Capacitance of the capacitors Cr and Cr− may be represented by a same signal var_C. The circuitry shown in FIG. 6*a* is for a differential input signal V; however, ordinary skilled person may easily modify the circuitry for a single-end input signal V.

By the timing shown in FIG. 6*b*, the ADC 600 may convert a sample V[2*i] of the input signal V to the sample D[2*i] of the output signal D during a cycle T[i], and convert a sample V[2*i+1] of the input signal V to the sample D[2*i+1] of the output signal D during a cycle U[i]. The cycle T[i] may start at time point p2 and end at time point u2, and the cycle U[i] may start at time point t2 and end at time point q2.

As shown in FIG. 6b, the cycles T[i] and U[i] may be arranged in an interleaving manner; a latter portion of the cycle T[i] (e.g., a latter half) may overlap with a former portion (e.g., a former half) of the cycle U[i], and a former portion (e.g., a former half) of a cycle T[i+1] consecutive to the cycle T[i] may overlap with a latter portion (e.g., a former half) of the cycle U[i]. The clocks cks1e, cks2e and ckc_e may be periodic and synchronize with each cycle T[i]. The clocks cks1o, cks2o and ckc_o may be periodic and synchronize with each cycle U[i]. Because the cycle T[i] for generating the sample D[2*i] and the cycle U[i] for generating the sample D[2*i] may be arranged in such interleaving manner, the ADC 600 may output each sample of the signal D at a clock ckD as shown in FIG. 6b, wherein a period TD of the clock ckD may be half of a period of the cycle T[i] (or U[i]). The signal var_C representing capacitance of the capacitor Cr (and Cr−) may be periodic and synchronize with each period of the clock ckD.

Within each cycle T[i], as shown by timing of the clock cks1e, the switch ss6e (and ss6e−) may be on from time points p2 to t2, and be off from time points t2 to u2. Within the cycle T[i], as shown by timing of the clock cks2e, the switch sr6e (and sr6e−) may be on from time points t3 to t7, and be off for the rest of the cycle T[i]. Within each cycle U[i], as shown by timing of the clock cks1o, the switch ss6o (and ss6o−) may be on from time points t2 to u2, and be off from time points u2 to q2. Within the cycle U[i], as shown by timing of the clock cks2o, the switch sr6o (and sr6o−) may be on from time points u3 to u7, and be off for the rest of the cycle U[i]. As shown in FIG. 6b, the clock ck1o may have the same wave shape as the clock ck1e, but lag behind the clock ck1e by the period TD of the clock ckD; similarly, the clock ck2o may have the same wave shape as the clock ck1e, but lag behind the clock ck2e by the period TD. As shown by timing of the signal var_C, within a period of the clock ckD, e.g., from time points t2 to u2, the capacitor Cr (and Cr−) may provide the capacitance n*C (denoted by "H") from time points t2 to t3b, and from time points t6 to u2; and, the capacitor Cr (and Cr−) may provide the capacitance 1*C (denoted by "L") from time points t3b to t6.

According to timing of the clocks cks1e, cks2e and the signal var_C shown in FIG. 6b, the cycle T[i] may be sectioned to include a sampling phase Ta[i] from time points p2 to t2, a combining phase Tf[i] from time points t3 to t3b, a scaling phase Tg[i] from time points t3b to t4, a comparison phase Tc[i] from time points t4 to t5, and another scaling phase Td[i] from time points t6 to t7. According to timing of the clocks cks1o, cks2o and the signal var_C, the cycle U[i] may be sectioned to include a sampling phase Ua[i] from time points t2 to u2, a combining phase Uf[i] from time points u3 to u3b, a scaling phase Ug[i] from time points u3b to u4, a comparison phase Uc[i] from time points u4 to u5, and another scaling phase Ud[i] from time points u6 to u7. As shown in FIG. 6b, the phases Tf[i], Tg[i], Tc[i] and Td[i] of the cycle T[i] may occur during the sampling phase Ua[i] of the cycle U[i]; similarly, the phases Uf[i], Ug[i], Uc[i] and Ud[i] of the cycle U[i] may occur during a sampling phase Ta[i+1] of a cycle T[i+1] following the cycle T[i].

During the sampling phase Ta[i] of the cycle T[i], the switch ss6e (and ss6e−) may be on, the switch sr6e (and sr6e−) may be off, and the capacitor Cr (and Cr−) may provide the capacitance n*C. In the phase Ta[i], the input signal V may be sampled to the capacitor array Cs (and Cs−) as the sample V[2*i].

During the combining phase Tf[i] of the cycle T[i], the switch ss6e (and ss6e−) may be off, the switch sr6e (and sr6e−) may turn on, the capacitor Cr (and Cr−) may keep providing the capacitance n*C, while the capacitance of the capacitor array Cs (and Cs−) may be k*C. Thus, in the phase Tf[i], the sample V[2*i] of the input signal V stored in the capacitor array Cs (and Cs−) and a value Vr(p7) of the signal Vr stored in the capacitor Cr (and Cr−) may be linearly combined by charge sharing, and the signal Vr at the node n6c (and n6c−) may be updated to a value Vr(t3b) as a combined signal.

During the scaling phase Tg[i] of the cycle T[i], the switch ss6e (and ss6e−) may remain off, the switch sr6e (and sr6e−) may remain on, and the capacitor Cr (and Cr−) may transit from the capacitance n*C to the capacitance 1*C. Thus, the signal Vr at the node n6c (and n6c−) may be scaled and be updated from the value Vr(t3b) to a value Vr(t4) as another combined signal.

During the comparison phase Tc[i] of the cycle T[i], the switch ss6e (and ss6e−) may remain off, the switch sr6e (and sr6e−) may remain on, and the comparator 620e may be enabled multiple times by a sequence of pulses when the clock ckc_e is on, so the control circuit 650e may successively obtain and register bits of the sample D[2*i] respectively during the pulses, and may control voltages of the capacitor array Cs (and Cs−) by the signal w6e (and w6e−) according to obtained bits of the sample D[i]. Thus, when the phase Tc[i] ends at time point t5, the signal Vr may be updated from the value Vr(t4) to a value Vr(t5) as an error signal by subtracting a feedback of the sample D[2*i] from the value Vr(t4).

During the scaling phase Td[i] of the cycle T[i], the switch ss6e (and ss6e−) may remain off, the switch sr6e (and sr6e−) may remain on, and the capacitor Cr (and Cr−) may transit from the capacitance 1*C to the capacitance n*C. Thus, the signal Vr may be scaled and be updated from the value Vr(t5) to a value Vr(t7).

After the scaling phase Td[i], because the switch sr6e (and sr6e−) may be off, the value Vr(t7) may be stored in the capacitor Cr (and Cr−) to be delayed to the combining phase Uf[i] of the cycle U[i] when the switch sr6o (and sr6o−) turns on. Hence, for the cycle U[i] during which the sample V[2*i+1] is converted to the sample D[2*i+1], the value Vr(t7) to be combined in the combining phase Ub[i] of the cycle U[i] is delayed from the cycle T[i] during which the sample V[2*i] is converted to the sample D[2*i]. Similarly, for the cycle T[i], the value Vr(p7) combined in the combining phase Tf[i] is delayed from a scaling phase Ud[i−1] (between time points p6 and p7) of a cycle U[i−1] during which a sample V[2*i−1] of the signal V is converted to a sample D[2*i−1] of the signal D.

On the other hand, during the sampling phase Ua[i] of the cycle U[i], the switch ss6o (and ss6o−) may be on, the switch sr6o (and sr6o−) may be off, and the capacitor Cr (and Cr−) may provide the capacitance n*C. In the phase Ua[i], the input signal V may be sampled to the capacitor array Cs2 (and Cs2−) as the sample V[2*i+1].

During the combining phase Uf[i] of the cycle U[i], the switch ss6o (and ss6o−) may be off, the switch sr6o (and sr6o−) may turn on, the capacitor Cr (and Cr−) may keep providing the capacitance n*C, while the capacitance of the capacitor array Cs (and Cs−) may be k*C. Thus, in the phase Uf[i], the sample V[2*i+1] of the input signal V stored in the capacitor array Cs2 (and Cs2−) and the value Vr(t7) of the signal Vr stored in the capacitor Cr (and Cr−) may be linearly combined by charge sharing, and the signal Vr at the node n6c (and n6c−) may be updated to a value Vr(u3b) as a combined signal.

During the scaling phase Ug[i] of the cycle U[i], the switch ss6o (and ss6o−) may remain off, the switch sr6o (and sr6o−) may remain on, and the capacitor Cr (and Cr−) may transit from the capacitance n*C to the capacitance 1*C. Thus, the signal Vr at the node n6c (and n6c−) may be scaled and be updated from the value Vr(u3b) to a value Vr(u4) as another combined signal.

During the comparison phase Uc[i] of the cycle U[i], the switch ss6o (and ss6o−) may remain off, the switch sr6o (and sr6o−) may remain on, and the comparator 620o may be enabled multiple times by a sequence of pulses when the clock ckc_o is on, so the control circuit 6500 may successively obtain and register bits of the sample D[2*i+1] respectively during the pulses, and may control voltages of the capacitor array Cs2 (and Cs2−) by the signal w6o (and w6o−) according to obtained bits of the sample D[2*i+1]. Thus, when the phase Uc[i] ends at time point u5, the signal Vr may be updated from the value Vr(u4) to a value Vr(u5) as an error signal by subtracting a feedback of the sample D[2*i+1] from the value Vr(u4).

During the scaling phase Ud[i] of the cycle U[i], the switch ss6o (and ss6o−) may remain off, the switch sr6o (and sr6o−) may remain on, and the capacitor Cr (and Cr−) may transit from capacitance 1*C to capacitance n*C. Thus, the signal Vr at the node n6c (and n6c−) may be scaled and be updated from the value Vr(u5) to a value Vr(u7). After the scaling phase Ud[i], because the switch sr6o (and sr6o−) may be off, the value Vr(t7) may be stored in the capacitor Cr (and Cr−) to be delayed to a combining phase Tf[i+1] (between time points q3 and q3b) of a cycle T[i+1] during which a sample V[2*i+2] of the signal V is converted to a sample D[2*i+2] of the signal D.

By aforementioned operation of the ADC 600, it is understood that the switches ss6e and sr6e (and ss6e− and sr6e−), the capacitor array Cs (and Cs−), the comparator 620e and the control circuit 650e may jointly operate with the capacitor Cr (and Cr−) to function as an ADC block (similar to the ADC 500 in FIG. 5a) for converting the sample D[2*i] to the sample V[2*i] during the cycle T[i]; on the other hand, the switches ss6o and sr6o (and ss6o− and sr6o−), the capacitor array Cs2 (and Cs2−), the comparator 6200 and the control circuit 6500 may jointly operate with the capacitor Cr (and Cr−) to function as another ADC block (similar to the ADC 500 in FIG. 5a) for converting the sample D[2*i+1] to the sample V[2*i+1] during the cycle U[i]. The two ADC blocks may share the same capacitor Cr (and Cr−) by operating in interleaving timing, so the ADC 600 may achieve a conversion rate (frequency of the clock ckD) twice faster than a conversion rate (e.g., frequency of the cycle T[i] or U[i]) of each individual ADC block.

Figure 7A:
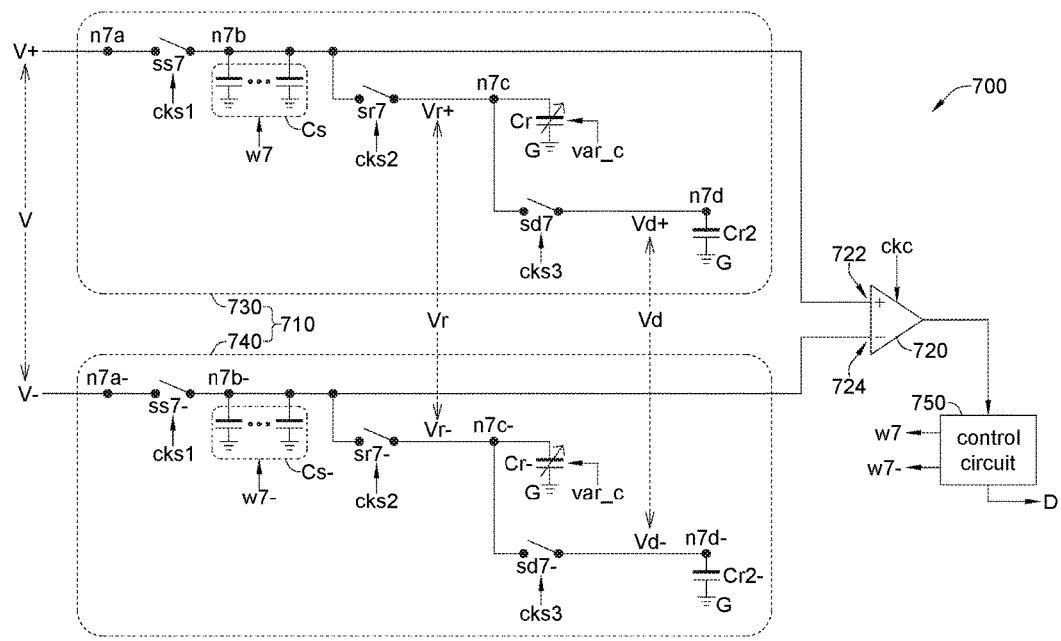
FIG. 7a illustrates an ADC according to an embodiment of the invention.
Figure 7B:
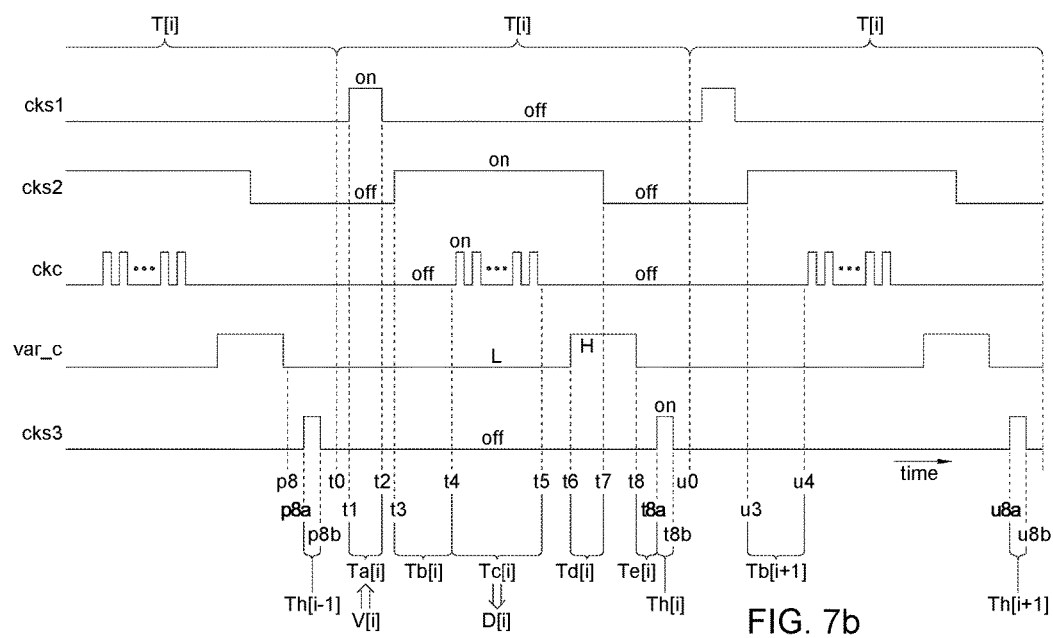
FIG. 7b illustrates operation timing according to an embodiment of the invention.
Figure 7C:
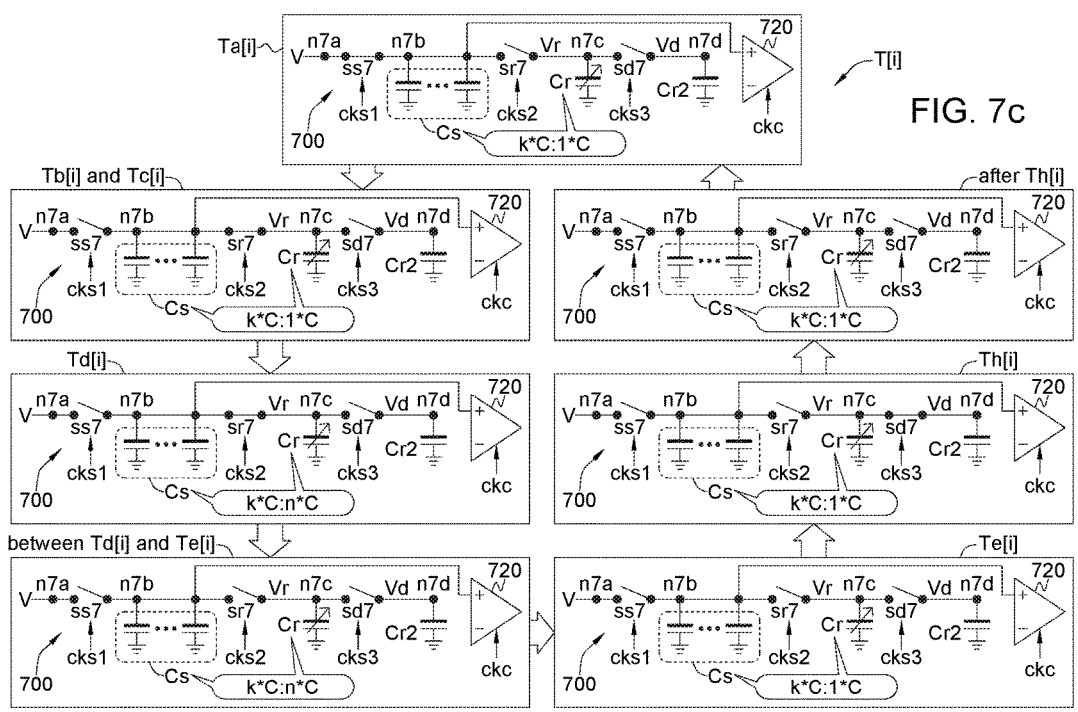
FIG. 7c illustrates operation of the ADC in FIG. 7a when the operation timing in FIG. 7b is adopted.
Figure 8A:
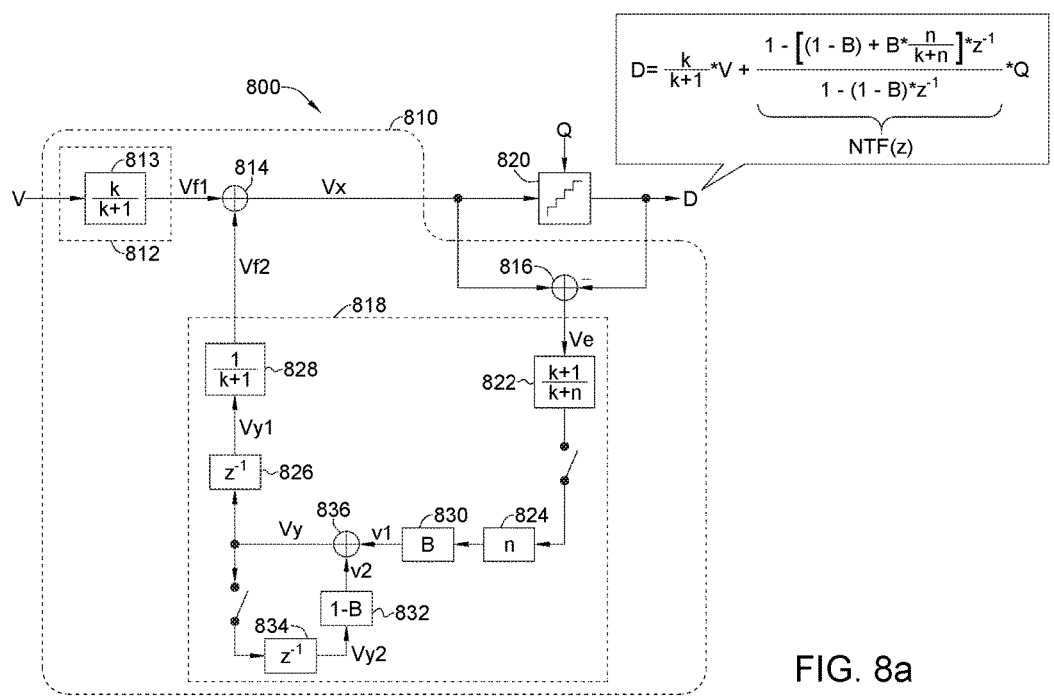
FIG. 8a illustrates an ADC according to an embodiment of the invention.
Figure 8B:
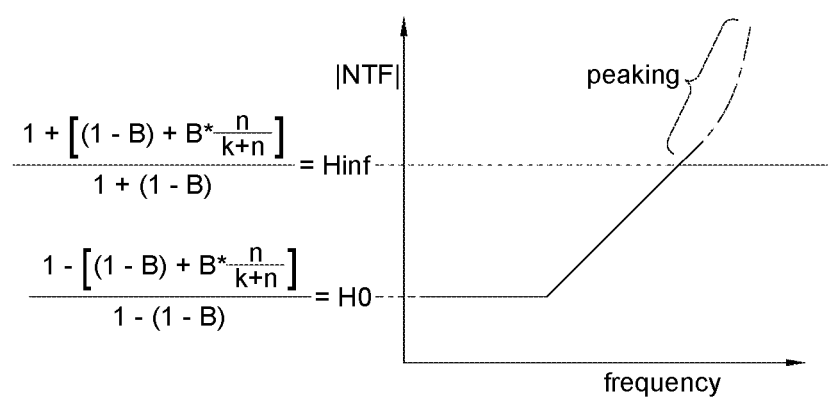

Please refer to FIGS. 7a, 7b and 7c, as well as 8a and 8b. FIG. 7a illustrates an ADC 700 according to an embodiment of the invention, FIG. 7b illustrates operation timing of the ADC 700, and FIG. 7c illustration operations of the ADC 700. FIG. 8a illustrates an ADC 800 according to an embodiment of the invention, wherein the ADC 700 in FIG. 7a may operate as shown in FIG. 7c to implement the ADC 800. FIG. 8b illustrates a spectrum of an NTF achieved by the ADC 800.

The ADC 800 shown in FIG. 8a may convert an analog input signal V to a digital output signal D, and may include a main circuit 810 and a comparator 820 coupled to the main circuit 810. The main circuit 810 may transfer the input signal V by an input transfer block 812 to form a transferred input signal Vf1, filter an error signal Ve by a loop filter 818 to form a filtered error signal Vf2, and form a combined signal Vx by combining (as a sum unit 814) the transferred input signal Vf1 (result of the input transfer block 812) and the filtered error signal Vf2 (result of the loop filter 818). The comparator 820 may quantize the combined signal Vx to provide the output signal D. The error signal Ve may reflect a difference (result of a sum unit 816) between the combined signal Vx and the output signal D.

The input transfer block 812 may include a scaling unit 813 for scaling the input signal V by a factor k/(k+1). The loop filter 818 may include two delay units 826 and 834, and scaling units 822, 824, 828, 830 and 832.

The scaling units 822, 824, 830, 832 and 828 may respectively scale signals by factors (k+1)/(k+n), n, B, (1−B) and 1/(k+1), with factors B, k and n being constants; for example, the factor B may be a positive number between 0 and 1. The scaling units 822, 824 and 830 may scale the error signal Ve to form a scaled error signal v1. The delay unit 834 may delay an internal signal Vy to form a delayed signal Vy2, the scaling unit 832 may scale the delayed signal Vy2 to form a scaled delayed signal v2, and the signal Vy may be a linear combination (weighted sum) of the error signal Ve and the delayed signal Vy2, i.e., be a sum (result of a sum unit 836) of the scaled error signal v1 and the scaled delayed signal v2. The delay unit 826 may delay the internal signal Vy to form a delayed signal Vy1, and the scaling unit 828 may scale the delayed signal Vy1 to form the filtered error signal Vf2.

The ADC 800 may achieve the NTF shown in FIG. 8b. As shown in FIG. 8b, the NTF may have a flat low-frequency response approaching a level H0 and a flat high-frequency response approaching a level Hinf. The ADC 800 may therefore avoid an undesired peaking at high-frequency band. In addition, by adjusting the factors n, k and B, the ADC 800 may provide flexibility to independently set desired values of the levels H0 and Hinf; i.e., setting desired value of the level H0 will not compromise the value of the level Hinf, and vice versa.

The ADC 700 shown in FIG. 7a may implement the ADC 800 in FIG. 8a and convert an analog input signal V to a digital output signal D; for example, convert a sample V[i] of the input signal V to a sample D[i] of the output signal D during a cycle T[i] shown in FIG. 7b.

As shown in FIG. 7a, the input signal V may be a differential signal between two input signals V+ and V−. The ADC 700 may be coupled to the input signals V+ and V− at nodes n7a and n7a−, and may include a main circuit 710, a comparator 720 and a control circuit 750. The comparator 720 may be controlled by a clock ckc, and include a positive terminal 722 and a negative terminal 724. When the clock ckc enables the comparator 720, the comparator 720 may compare signal levels (e.g., voltages) at the positive terminal 722 and the negative terminal 724, and generate a comparison result.

The control circuit 750 may be coupled to an output terminal of the comparator 720, and may generate the output signal D by successively registering comparison results of the comparator 720; the control circuit 750 may also generate two control signals w7 and w7− in response to the comparison results of the comparator 720. The main circuit 710 may include two internal circuits 730 and 740, wherein the internal circuit 730 may be coupled between the input signal V+ and the positive terminal 722 of the comparator 720, and the internal circuit 740 may be coupled between the input signal V− and the negative terminal 724 of the comparator 720.

The internal circuit 730 may include a capacitor array Cs coupled to a node n7b, an auxiliary capacitor Cr coupled between nodes n7c and G, a second auxiliary capacitor Cr2 coupled between nodes n7d and G, a switch ss7 coupled between the nodes n7a and n7b, a switch sr7 coupled between the nodes n7b and n7c, and a switch sd7 coupled between the nodes n7c and n7d. For example, the capacitor array Cs may include a number Nb of binary weighted capacitors; in an embodiment, top plates of the capacitors in the capacitor array Cs may be commonly coupled to the node n7b, while voltages at bottom plates of the capacitors in the capacitor array Cs may be controlled by the control signal w7.

For the differential form of the input signal V, the internal circuit 740 may match the internal circuit 730, and may therefore include a capacitor array Cs− coupled to a node n7b−, an auxiliary capacitor Cr− coupled between nodes n7c− and G, a second auxiliary capacitor Cr2− coupled between nodes n7d− and G, a switch ss7− coupled between the nodes n7a− and n7b−, a switch sr7− coupled between the nodes n7b− and n7c−, and a switch sd7− coupled between the nodes n7c− and n7d−. For example, the capacitor array Cs− may include the same number Nb of binary weighted capacitors as the capacitor array Cs; in an embodiment, top plates of the capacitors in the capacitor array Cs− may be commonly coupled to the node n7b−, while voltages at bottom plates of the capacitors in the capacitor array Cs− may be controlled by the control signal w7−.

As shown in FIG. 7a, the positive terminal 722 of the comparator 720 may be coupled to the node n7b, and the negative terminal 724 may be coupled to the node n7b−. The switches ss7 and ss7− may be controlled by a same clock cks1. The switches sr7 and sr7− may be controlled by a same clock cks2. The switches sd7 and sd7− may be controlled by a same clock cks3. In an embodiment, the capacitor Cr (and Cr−) may be variable to selectively provide a first capacitance 1*C and a different second capacitance n*C, with C a constant. Capacitance of the capacitor Cr and Cr− may be represented by a same signal var_c. A signal Vr+ at the node n7c and a signal Vr− at the node n7c− may form a differential signal Vr. A signal Vd+ at the node n7d and a signal Vd− at the node n7c− may form a differential signal Vd.

The circuitry shown in FIG. 7a is for a differential input signal V; however, ordinary skilled person may easily modify the circuitry for a single-end input signal V. For example, the single-end input signal V may be the input signal V+, with the input signal V− and the signals Vr− and Vd− being constant ground signals, and the internal circuit 740 simplified to wiring conducting the negative terminal 724 of the comparator 720 to ground.

As shown in FIG. 7b, the cycle T[i] for converting the sample D[i] to the sample V[i] may start at time point t0 and end at time point u0. Within each cycle T[i], as shown by timing of the clock cks1, the switch ss7 (and ss7−) may be on from time points t1 to t2, and be off for the rest of the cycle T[i]. Within the cycle T[i], as shown by timing of the clock cks2, the switch sr7 (and sr7−) may be on from time points t3 to t7, and be off for the rest of the cycle T[i]. Within the cycle T[i], as shown by timing of the signal var_c, the capacitor Cr (and Cr−) may provide the capacitance n*C (denoted by "H") from time points t6 to t8, and provide the capacitance 1*C (denoted by "L") for the rest of the cycle T[i]. Within the cycle T[i], as shown by timing of the clock cks3, the switch sd7 (and sd7−) may be on from time points t8a to t8b, and be off for the rest of the cycle T[i].

According to timing of the clocks cks1, cks2, cks3 and the signal var_c, the cycle T[i] may be sectioned to include a sampling phase Ta[i] from time points t1 to t2, a combining phase Tb[i] from time points t3 to t4, a comparison phase Tc[i] from time points t4 to t5, a first scaling phase Td[i] from time points t6 to t7, a second scaling phase Te[i] from time points t8 to t8a, and an additional phase Th[i] from time points t8a to t8b.

For the ADC 700 to implement the ADC 800 in FIG. 8a, during the sampling phase Ta[i] (see also FIG. 7c in which the ADC 700 is illustrated in a simplified manner for clear demonstration without losing generality), the switch ss7 (and ss7−) may be on, the switch sr7 and sd7 (and sr7−, sd7−) may be off, and the capacitor Cr (and Cr−) may provide the capacitance 1*C. Thus, in the phase Ta[i], the input signal V may be sampled to the capacitor array Cs (and Cs−) as the sample V[i].

During the combining phase Tb[i] of the cycle T[i], the switch ss7 and sd7 (and ss7−, sd7−) may be off, the switch sr7 (and sr7−) may be on, the capacitor Cr (and Cr−) may provide the capacitance 1*C, while the capacitance of the capacitor array Cs (and Cs−) may be k*C. Thus, in the phase Tb[i], the sample V[i] of the input signal V stored in the capacitor array Cs (and Cs−) and a value Vr(p8b) of the signal Vr stored in the capacitor Cr may be linearly combined by charge sharing, and the signal Vr at the node n7c (and n7c−) may be updated to a value Vr(t4) to form the combined signal Vx in FIG. 8a. In other words, during the combining phase Tb[i], the main circuit 710 may implement the input scaling unit 813 of the input transfer block 812 (FIG. 8a) to scale the input signal V (the sample V[i]) by the factor k/(k+1), implement the loop scaling unit 828 to scale an output of the delay unit 826 (the value Vr(p8b)) by the factor 1/(k+1), and implement the sum unit 814 to sum up the scaled signals V[i]*k/(k+1) and Vr(p8b)*1/(k+1) as the signal Vx=Vr(t4).

During the comparison phase Tc[i] of the cycle T[i], the switch ss7 (and ss7−) may remain off, the switch sr7 (and sr7−) may remain on, the switch sd7 (and sd7−) may remain off, and the comparator 720 may be enabled multiple times by a sequence of pulses when the clock ckc is on, so the control circuit 750 may successively obtain and register bits of the sample D[i] respectively during the pulses, and may control voltages of the capacitor array Cs (and Cs−) by the signal w7 (and w7−) according to obtained bits of the sample D[i]. In a final pulse of the phase Tc[i], the control circuit 750 may register the last bit of the sample D[i], and control voltages of the capacitor array Cs (and Cs−) by the signals w7 (and w7−) to subtracting a last value which reflects the last bit. Thus, when the phase Tc[i] ends at time point t5, the signal Vr may be updated from the value Vr(t4) to a value Vr(t5) by subtracting a feedback of the sample D[i] from the value Vr(t4). In other words, during the phase Tc[i], the comparator 720 may quantize the combined signal Vx=Vr(t4) and provide the sample D[i] of the output signal D, and the capacitor array Cs (and Cs−) may implement the sum unit 816 (FIG. 8a) to receive feedback of the output signal D and form the error signal Ve=Vr(t5). It is noted that prior art SAR ADC will not subtract the last value reflecting the last bit from the capacitor array.

During the scaling phase Td[i] of the cycle T[i], the switch ss7 (and ss7−) may remain off, the switch sr7 (and sr7−) may remain on, the switch sd7 (and sd7−) may remain off, and the capacitor Cr (and Cr−) may transit from the capacitance 1*C to the capacitance n*C. Thus, the signal Vr at the node n7c (and n7c−) may be scaled by the factor (k+1)/(k+n) and be updated from the value Vr(t5) to a value Vr(t7). In other words, during the scaling phase Td[i], the main circuit 710 may implement the loop scaling unit 822 in FIG. 8a to scale the signal Ve=Vr(t5) by the factor (k+1)/(k+n). At time point t7, the switch sr7 (and sr7−) may transit to off.

During the scaling phase Te[i] of the cycle T[i], the switch ss7 (and ss7−) may remain off, the switch sr7 (and sr7−) may be off, the switch sd7 (and sd7−) may remain off, and the capacitor Cr (and Cr−) may transit to provide the capacitance 1*C. Thus, the signal Vr at the node n7c (and n7c−) may be scaled by the factor n and be updated from the value Vr(t7) to a value Vr(t8a). In other words, during the scaling phase Te[i], the main circuit 710 may implement the loop scaling unit 824 in FIG. 8a.

During the additional phase Th[i] of the cycle T[i], the switch ss7 (and ss7−) may remain off, the switch sr7 (and sr7−) may remain off, the switch sd7 (and sd7−) may turn to be on, and the capacitor Cr (and Cr−) may remain the capacitance 1*C. Thus, in the phase Th[i], the value Vr(t8a) in the capacitor Cr (and Cr−) and a value Vr(p8b) stored in the capacitor Cr2 (and Cr2−) may be linearly combined by charge sharing, and the signal Vr at the node n7c (and n7c−) may be updated to a value Vr(t8b) to form the internal signal Vy in FIG. 8a. In other words, during the additional phase Tb[i], the main circuit 710 may implement the scaling unit 830 (FIG. 8a) to scale an output of the scaling unit 824 (the value Vr(t8a)) by the factor B, implement the scaling unit 832 to scale an output of the delay unit 834 (the value Vr(p8b)) by the factor (1−B), and implement the sum unit 836 to sum the scaled values Vr(t8a)*B and Vr(p8b)*(1−B) as the internal signal Vy=Vr(t8b). The factor B may be determined by the capacitances of the capacitors Cr and Cr2, e.g., B=Cr/(Cr+Cr2).

After the additional phase Th[i], because the switch sd7 (and sd7−) may be off, the value Vr(t8b) may be stored in the capacitor Cr2 (and Cr2−) to be delayed to an additional phase Th[i+1] (between time points u8a and u8b) of a subsequent cycle T[i+1]. Hence, for the cycle T[i+1], the value Vr(t8b) to be linearly combined with a value Vr(u8a) in the phase Th[i+1] is delayed from the cycle T[i]; similarly, for the cycle T[i], the value Vr(p8b) to be combined with the value Vr(t8a) in the phase Th[i] is delayed from an additional phase Th[i−1](between time points p8a and p8b) of a previous cycle T[i−1]. In other words, by keeping the switch sd7 (and sd7−) off from time points t8b (after the phase Th[i]) to u8a (before the phase Th[i+1]), the main circuit 710 may implement the delay unit 834 in FIG. 8a.

After the additional phase Th[i], because the switch sr7 (and sr7−) may be off, the value Vr(t8b) may be stored in the capacitor Cr (and Cr−) to be delayed to a combining phase Tb[i+1] (between time points u3 and u4) of the subsequent cycle T[i+1]. Hence, for the cycle T[i+1], the value Vr(t8b) to be linearly combined with a sample V[i+1] in the phase Tb[i+1] is delayed from the cycle T[i]; similarly, for the cycle T[i], the value Vr(p8b) to be combined with the sample V[i] in the phase Tb[i] is delayed from the additional phase Th[i−1] of the previous cycle T[i−1]. In other words, by keeping the switch sr7 (and sr7−) off from time points t8b (after the phase Th[i]) to u3 (before the phase Tb[i+1]), the main circuit 710 may implement the delay unit 826 in FIG. 8a.

The variable capacitor Cr (and Cr−) in FIG. 3a, 4a, 6a or 7a may be a varactor realized by MOSCAP (Metal-Oxide-Semiconductor capacitor), MOMCAP (Metal-Oxide-Metal capacitor) and/or MIMCAP (Metal-Insulator-Metal capacitor), etc. Please refer to FIGS. 9a to 9e respectively illustrating variable capacitors Cr9a to Cr9e according to embodiments of the invention. The capacitor Cr (and Cr−) in FIG. 3a, 4a, 6a or 7a may be implemented by the capacitor Cr9a, Cr9b, Cr9c, Cr9d or Cr9e in FIG. 9a, 9b, 9c, 9d or 9e.

Figure 9A:
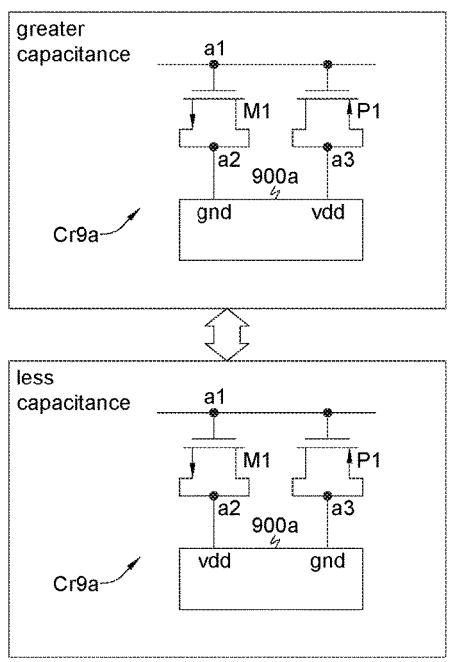

As shown in FIG. 9a, the capacitor Cr9a may include an n-channel MOS transistor M1, a p-channel MOS transistor P1 and a bias circuit 900a, wherein gate terminals of the transistors M1 and P1 may be commonly coupled to a node a1, drain and source terminals of the transistor M1 may be commonly coupled to a node a2, drain and source terminals of the transistor P1 may be commonly coupled to a node a3, and the bias circuit 900a may be coupled to the nodes a2 and a3, and may control voltages at the nodes a2 and a3. For the capacitor Cr9a to implement the capacitor Cr in FIG. 3a, 4a, 6a or 7a, the node a1 in FIG. 9a may be the node n3c, n4c, n6c or n7c in FIG. 3a, 4a, 6a or 7a. To provide a greater capacitance (e.g., n*C in FIG. 3c, 4b, 5c or 7c), the bias circuit 900a may arrange the node a2 to be coupled to a ground voltage gnd, and arrange the node a3 to be coupled to a supply voltage vdd. To provide a less capacitance (e.g., 1*C in FIG. 3c, 4b, 5c or 7c), the bias circuit 900a may arrange the node a2 to be coupled to the supply voltage vdd, and arrange the node a3 to be coupled to the ground voltage gnd. The capacitor Cr9a may be simplified to adopt a single MOS transistor M1 or P1 instead of two complement MOS transistors M1 and P1.

Figure 9C:
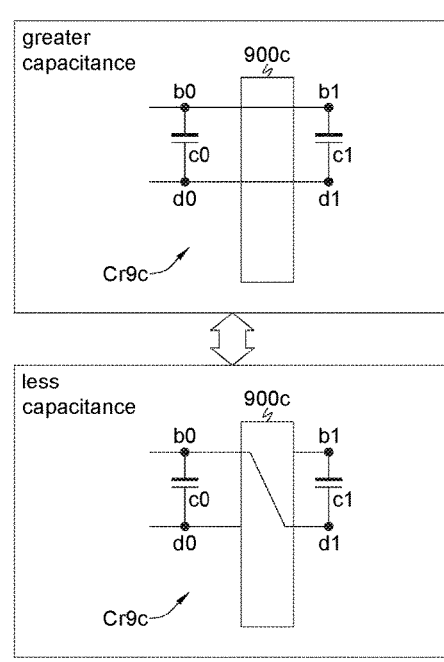
Figure 9B:
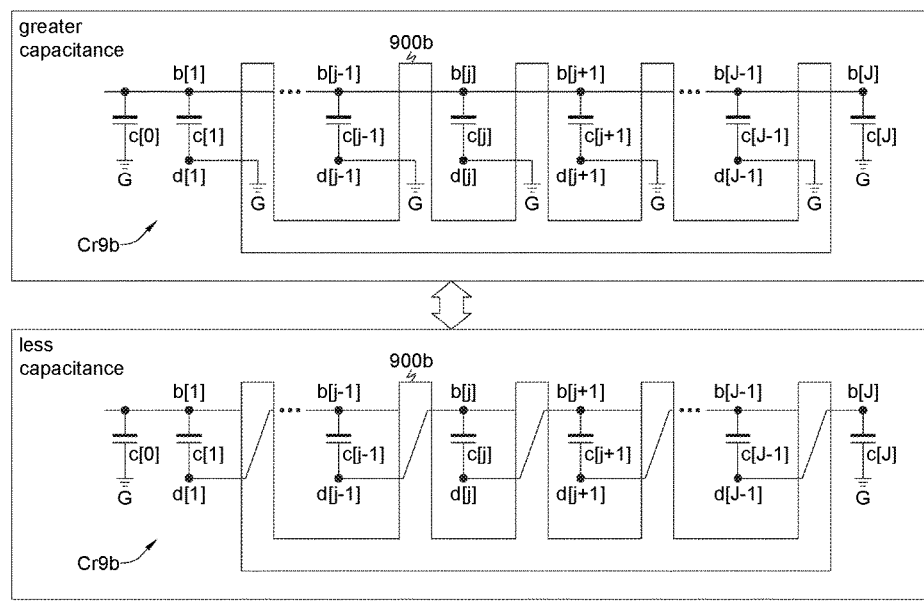

As shown in FIG. 9b, the capacitor Cr9b may include a plurality of capacitors c[0] to c[J] and a switching circuit 900b coupled to a top plate and a bottom plate of each capacitor c[j] respectively at a node b[j] and a node d[j], for j=1 to J, wherein a top plate and a bottom plate of the capacitor c[0] may be respectively coupled to the node b[1] and a node G (e.g., a ground node), and a bottom plate of the capacitor c[J] may be coupled to the node G. For the capacitor Cr9b to implement the capacitor Cr in FIG. 3a, 4a, 6a or 7a, the node b[1] in FIG. 9b may be the node n3c, n4c, n6c or n7c in FIG. 3a, 4a, 6a or 7a. To provide a greater capacitance (e.g., n*C in FIG. 3c, 4b, 5c or 7c), the switching circuit 900b may, for j=1 to (J−1), arrange the node b[j] to be coupled to the node b[j+1], and arrange the node d[j] to be coupled to the node G. That is, the switching circuit 900b may arrange the capacitors c[0] to c[J] to be shunted for providing greater capacitance. To provide a less capacitance (e.g., 1*C in FIG. 3c, 4b, 5c or 7c), the switching circuit 900b may, for j=1 to (J−1), arrange the node b[j] not to be coupled to the node b[j+1], and arrange the node d[j] to be coupled to the node b[j+1] instead of the node G. In other words, the switching circuit 900b may arrange the capacitors c[1] to c[J] to be serial for providing less capacitance. For j=0 to J, capacitance of each capacitor c[j] may be C/n.

As shown in FIG. 9c, the capacitor Cr9c may include two capacitors c0 and c1, and a switching circuit 900c coupled to a top plate and a bottom plate of the capacitor c0 respectively at a node b0 and a node d0, and coupled to a top plate and a bottom plate of the capacitor c1 respectively at a node b1 and a node d1. The capacitor Cr9c may provide variable capacitance between the nodes b0 and d0. To provide a greater capacitance (e.g., n*C in FIG. 3c, 4b, 5c or 7c), the switching circuit 900c may arrange the node b0 to be coupled to the node b1, and arrange the node d0 to be coupled to the node d1. That is, the switching circuit 900b may arrange the capacitor c1 to be shunted to the capacitor c0 for providing greater capacitance. To provide a less capacitance (e.g., 1*C in FIG. 3c, 4b, 5c or 7c), the bias circuit 900a may arrange the node b0 to be coupled to the node d1 instead of the node b1, and arrange the node d0 not to be coupled to the node d1. Capacitances of the capacitors c0 and c1 may respectively be r*C and (1−r)*C, with the term r being a positive constant less than 1.

As shown in FIG. 9d, the capacitor Cr9d may include two capacitors c2 and c3, and two switches sw1 and sw2. The capacitor c2 may be coupled between two nodes b2 and d2, the switch sw1 may be coupled between the nodes d2 and G. The capacitor c3 and sw2 may be serially coupled between the nodes d2 and G; for example, the capacitor c3 may be coupled between the nodes d2 and e2, and the switch sw2 may be coupled between the nodes e2 and G. For the capacitor Cr9d to implement the capacitor Cr in FIG. 3a, 4a, 6a or 7a, the node b2 in FIG. 9d may be the node n3c, n4c, n6c or n7c in FIG. 3a, 4a, 6a or 7a. To provide a greater capacitance, the switch sw1 may be on (closed) to conduct the node d2 to the node G, and the switch sw2 may be off (open) to stop conduction between the nodes e2 and G. To provide a less capacitance, the switch sw1 may be off to stop conduction between the nodes d2 and G, and the switch sw2 may be on to conduct the node e2 to the node G.

As shown in FIG. 9e, the capacitor Cr9e may include two capacitors c4 and c5, and a switch sw3. The capacitor c4 may be coupled between two nodes b3 and d3, the switch sw3 may be coupled between the nodes d3 and G. The capacitor c5 may be coupled between the nodes d3 and G. For the capacitor Cr9e to implement the capacitor Cr in FIG. 3a, 4a, 6a or 7a, the node b3 in FIG. 9e may be the node n3c, n4c, n6c or n7c in FIG. 3a, 4a, 6a or 7a. To provide a greater capacitance, the switch sw3 may be on (closed) to conduct the node d3 to the node G, and thus cause the capacitor c5 to be bypassed. To provide a less capacitance, the switch sw1 may be off to stop conduction between the nodes d3 and G.

To sum up, the invention may provide improved ADC with enhanced noise shaping. As shown in FIG. 3a, 4a, 6a or 7a, the ADC according to the invention may be implemented based on SAR ADC, along with passive elements, e.g., variable capacitor(s) and switch(es), so as to avoid adverse impact (e.g., noise, power consumption and/or area overhead) of additional active building block(s) (such as additional amplifier(s)) and/or active components (such as additional input stage(s) for implementing a comparator having more than two input terminals).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An analog-to-digital converter (ADC) converting an input signal to an output signal; the ADC comprising:
   a main circuit for: scaling the input signal by a first factor, filtering an error signal by a loop filter, and forming a combined signal combining the scaled input signal and the filtered error signal; and
   a comparator coupled to the main circuit, for quantizing the combined signal to provide the output signal;
   wherein the error signal reflects a difference between the combined signal and the output signal;
   the loop filter comprises a first delay unit and at least a loop scaling unit, for delaying and scaling the error signal by a second factor; and
   a sum of the first factor and the second factor equals one.

2. The ADC of claim 1, wherein:
   the loop filter further comprises a second delay unit for delaying an internal signal to form a second delayed signal, wherein the internal signal is a combination of the error signal and the second delayed signal; and
   the first delay unit is arranged to delay the internal signal to form a first delayed signal, wherein the filtered error signal is formed by scaling the first delayed signal.

3. The ADC of claim 1 coupled to the input signal at a first node, and converting a sample of the input signal to a sample of the output signal during a cycle, wherein the main circuit comprises:
   a capacitor array coupled to a second node;
   an auxiliary capacitor coupled to a third node;
   a first switch coupled between the first node and the second node; and
   a second switch coupled between the second node and the third node;
   wherein the cycle comprises a sampling phase, a combining phase and a comparison phase;
   during the sampling phase, the first switch is on to conduct the first node to the second node, and the second switch is off to stop conduction between the second node and the third node;
   during the combining phase, the first switch is off to stop conduction between the first node and the second node, and the second switch is on to conduct the third node to the second node, so the combined signal is formed at the second node;
   during the comparison phase, the first switch is off, the second switch is on, the comparator is enabled to quantize the combined signal and provide the sample of the output signal, and the capacitor array receives a feedback of the output signal to form the error signal at the second node.

4. The ADC of claim 3, wherein:
   the auxiliary capacitor is variable to selectively provide a first capacitance and a different second capacitance;
   the cycle further comprises a first scaling phase after the comparison phase;
   during the comparison phase, the auxiliary capacitor provides the first capacitance; and
   during the first scaling phase, the first switch is off, the second switch is on, and the auxiliary capacitor provides the second capacitance.

5. The ADC of claim 4, wherein:
   the cycle further comprises a second scaling phase after the first scaling phase;
   during the second scaling phase, the first switch and the second switch are off, and the auxiliary capacitor provides the first capacitance.

6. The ADC of claim 4, wherein:
   the cycle further comprises a second scaling phase between the combining phase and the comparison phase;
   during the second scaling phase, the first switch is off, the second switch is on, and the auxiliary capacitor provides the first capacitance.

7. The ADC of claim 3, wherein:
   the comparator comprises a positive terminal and a negative terminal, and quantizes the combined signal by comparing signals at the positive terminal and the negative terminal; and
   the positive terminal is coupled to the third node.

8. The ADC of claim 3, wherein:
   the comparator comprises a positive terminal and a negative terminal, and quantizes the combined signal by comparing signals at the positive terminal and the negative terminal; and
   the positive terminal is coupled to the second node.

9. The ADC of claim 8 further converting a second sample of the input signal to a second sample of the output signal during a second cycle, and further comprising:

a second comparator coupled to the main circuit, for quantizing a second combined signal to provide the second sample of the output signal;

wherein the main circuit further comprises:

a second capacitor array coupled to a fourth node;

a third switch coupled between the first node and the fourth node; and a fourth switch coupled between the fourth node and the third node;

wherein the second cycle comprises a second sampling phase, a second combining phase and a second comparison phase;

during the second sampling phase, the first switch is off, the third switch is on to conduct the first node to the fourth node, and the fourth switch is off to stop conduction between the fourth node and the third node; and the combining phase occurs during the second sampling phase.

10. The ADC of claim 9, wherein:

the auxiliary capacitor is variable to selectively provide a first capacitance and a different second capacitance;

the cycle further comprises a first scaling phase after the comparison phase;

the second cycle further comprises a second combining phase, a second comparison phase, and a third scaling phase;

during the second combining phase, the first switch is on, the third switch is off to stop conduction between the first node and the fourth node, the fourth switch is on to conduct the fourth node to the third node, so the second combined signal may be formed at the fourth node;

during the second comparison phase, the first switch is on, the third switch is off, the fourth switch is on, the second comparator is enabled to quantize the second combined signal and provide the second sample of the output signal, and the second capacitor array receives a feedback of the output signal to form, at the fourth node, a second error signal reflecting a difference between the second combined signal and the output signal;

during the comparison phase and the second comparison phase, the auxiliary capacitor provides the first capacitance;

during the first scaling phase, the first switch and the fourth switch are off, the second switch and the third switch are on, and the auxiliary capacitor provides the second capacitance; and during the third scaling phase, the second switch and the third switch are off, the first switch and the fourth switch are on, and the auxiliary capacitor provides the second capacitance.

11. The ADC of claim 10, wherein:

the cycle further comprises a second scaling phase between the combining phase and the comparison phase;

the second cycle further comprises a fourth scaling phase between the second combining phase and the second comparison phase;

during the second scaling phase, the first switch and the fourth switch are off, the second switch and the third switch are on, and the auxiliary capacitor provides the first capacitance; and during the fourth scaling phase, the second switch and the third switch are off, the first switch and the fourth switch are on, and the auxiliary capacitor provides the first capacitance.

12. The ADC of claim 9, wherein:

the second comparator comprises a second positive terminal and a second negative terminal, and quantizes the second combined signal by comparing signals at the second positive terminal and the second negative terminal; and the second positive terminal is coupled to the fourth node.

13. The ADC of claim 3, wherein the main circuit further comprises:

a second auxiliary capacitor coupled to a fourth node; and a third switch coupled between the third node and the fourth node;

wherein the cycle further comprises an additional phase after the comparison phase;

during the sampling phase, the combining phase and the comparison phase, the third switch is off to stop conduction between the third node and the fourth node; and during the additional phase, the first switch and the second switch are off, and the third switch is on to conduct the third node to the fourth node.

14. The ADC of claim 13, wherein:

the auxiliary capacitor is variable to selectively provide a first capacitance and a different second capacitance;

the cycle further comprises a first scaling phase between the comparison phase and the additional phase;

during the comparison phase, the auxiliary capacitor provides the first capacitance; and during the first scaling phase, the first switch and the third switch are off, the second switch is on, and the auxiliary capacitor provides the second capacitance.

15. The ADC of claim 14, wherein:

the cycle further comprises a second scaling phase between the first scaling phase and the additional phase;

during the second scaling phase, the first switch, the second switch and the third switch are off, and the auxiliary capacitor provides the first capacitance.

16. An ADC coupled to an input signal at a first node, and converting a sample of the input signal to a sample of the output signal during a cycle, wherein the ADC comprises:

a comparator for quantizing a combined signal to provide the sample of the output signal;

a capacitor array coupled to a second node;

an auxiliary capacitor coupled to a third node;

a first switch coupled between the first node and the second node; and a second switch coupled between the second node and the third node;

wherein the cycle comprises a sampling phase, a combining phase and a comparison phase;

during the sampling phase, the first switch is on to conduct the first node to the second node, and the second switch is off to stop conduction between the second node and the third node;

during the combining phase, the first switch is off to stop conduction between the first node and the second node, and the second switch is on to conduct the third node to the second node, so the combined signal is formed at the second node;

during the comparison phase, the first switch is off, the second switch is on, the comparator is enabled to quantize the combined signal and provide the sample of the output signal, and the capacitor array receives a feedback of the output signal to form an error signal at the second node.

17. The ADC of claim 16, wherein:
the auxiliary capacitor is variable to selectively provide a first capacitance and a different second capacitance;
the cycle further comprises a first scaling phase after the comparison phase;
during the comparison phase, the auxiliary capacitor provides the first capacitance; and
during the first scaling phase, the first switch is off, the second switch is on, and the auxiliary capacitor provides the second capacitance.

18. The ADC of claim 17, wherein:
the cycle further comprises a second scaling phase after the first scaling phase;
during the second scaling phase, the first switch is off, the second switch is off, and the auxiliary capacitor provides the first capacitance.

19. The ADC of claim 17, wherein:
the cycle further comprises a second scaling phase between the combining phase and the comparison phase;
during the second scaling phase, the first switch is off, the second switch is on, and the auxiliary capacitor provides the first capacitance.

20. An ADC converting an input signal to an output signal; the ADC comprising:
a main circuit of passive elements, for: transferring the input signal by an input transfer block, filtering an error signal by a loop filter, and forming a combined signal combining the transferred input signal and the filtered error signal; and
a comparator coupled to the main circuit, for quantizing the combined signal to provide the output signal;
wherein the error signal reflects a difference between the combined signal and the output the input transfer block comprises an input scaling unit for scaling the input signal by a first factor;
the loop filter comprises a first delay unit and at least a loop scaling unit, for delaying and scaling the error signal by a second factor; and
a sum of the first factor and the second factor equals one.

21. The ADC of claim 20 coupled to the input signal at a first node, and converting a sample of the input signal to a sample of the output signal during a cycle, wherein the main circuit comprises:
a capacitor array coupled to a second node;
an auxiliary capacitor coupled to a third node;
a first switch coupled between the first node and the second node; and
a second switch coupled between the second node and the third node;
wherein the cycle comprises a sampling phase, a combining phase and a comparison phase;
during the sampling phase, the first switch is on to conduct the first node to the second node, and the second switch is off to stop conduction between the second node and the third node;
during the combining phase, the first switch is off to stop conduction between the first node and the second node, and the second switch is on to conduct the third node to the second node, so the combined signal is formed at the second node;
during the comparison phase, the first switch is off, the second switch is on, the comparator is enabled to quantize the combined signal and provide the sample of the output signal, and the capacitor array receives a feedback of the output signal to form the error signal at the second node.

22. The ADC of claim 21, wherein:
the auxiliary capacitor is variable to provide a first capacitance and a different second capacitance respectively during different portions of the cycle.

* * * * *